(12) United States Patent
Ide et al.

(10) Patent No.: US 8,952,689 B2
(45) Date of Patent: Feb. 10, 2015

(54) MAGNETIC SENSOR AND MAGNETIC BALANCE TYPE CURRENT SENSOR UTILIZING SAME

(75) Inventors: Yosuke Ide, Niigata-ken (JP); Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 312 days.

(21) Appl. No.: 13/607,467

(22) Filed: Sep. 7, 2012

(65) Prior Publication Data
US 2012/0326715 A1 Dec. 27, 2012

Related U.S. Application Data

(63) Continuation of application No. PCT/JP2011/055185, filed on Mar. 7, 2011.

(30) Foreign Application Priority Data

Mar. 12, 2010 (JP) ................................ 2010-056156

(51) Int. Cl.
G01R 33/09 (2006.01)
B82Y 25/00 (2011.01)
G01R 15/20 (2006.01)

(52) U.S. Cl.
CPC ............... *G01R 33/093* (2013.01); *B82Y 25/00* (2013.01); *G01R 15/205* (2013.01)
USPC .......................................... 324/252; 324/249

(58) Field of Classification Search
USPC .................................... 324/252, 249
See application file for complete search history.

(56) References Cited

U.S. PATENT DOCUMENTS

| 5,561,368 | A | 10/1996 | Dovek et al. |
| 6,970,332 | B2 | 11/2005 | Tetsukawa et al. |
| 7,336,070 | B2 | 2/2008 | Sasaki et al. |
| 7,460,343 | B2 | 12/2008 | Carey et al. |
| 7,533,456 | B2 | 5/2009 | Tsuchiya et al. |
| 7,554,775 | B2 | 6/2009 | Li et al. |
| 7,639,005 | B2 | 12/2009 | Qian et al. |
| 8,269,492 | B2 | 9/2012 | Saito et al. |

(Continued)

FOREIGN PATENT DOCUMENTS

| JP | 7-318591 | 12/1995 |
| JP | 8-15322 | 1/1996 |

(Continued)

OTHER PUBLICATIONS

Notice of Allowance dated Jul. 27, 2012 from U.S. Appl. No. 12/891,550.

(Continued)

*Primary Examiner* — Reena Aurora
(74) *Attorney, Agent, or Firm* — Beyer Law Group LLP

(57) ABSTRACT

A magnetism sensor comprises a magnetoresistive element, the resistance of which changes due to the application of an induced magnetic field from the current being measured, and a fixed-resistance element. The fixed-resistance element has a self-pinned ferromagnetic fixed layer comprising a first ferromagnetic film and a second ferromagnetic film coupled antiferromagnetically with an antiparallel coupling film interposed therebetween. The antiparallel coupling film is a ruthenium film that exhibits an antiferromagnetic coupling effect with a first peak thickness. The difference between the degrees of magnetization of the first ferromagnetic film and the second ferromagnetic film is effectively zero.

13 Claims, 14 Drawing Sheets

(56) References Cited

U.S. PATENT DOCUMENTS

| | | |
|---|---|---|
| 8,519,704 B2 | 8/2013 | Ide et al. |
| 8,564,282 B2 | 10/2013 | Hoshiya et al. |
| 8,760,158 B2 | 6/2014 | Ichionhe et al. |
| 2004/0213071 A1 | 10/2004 | Hiramoto et al. |
| 2004/0223266 A1 | 11/2004 | Li |
| 2004/0246632 A1 | 12/2004 | Nishioka et al. |
| 2005/0237676 A1 | 10/2005 | Gill |
| 2006/0002038 A1 | 1/2006 | Gill |
| 2006/0012927 A1 | 1/2006 | Seino et al. |
| 2006/0077598 A1 | 4/2006 | Taylor et al. |
| 2007/0076469 A1 | 4/2007 | Ashida et al. |
| 2007/0091509 A1 | 4/2007 | Yi et al. |
| 2007/0200564 A1 | 8/2007 | Motz et al. |
| 2007/0297220 A1 | 12/2007 | Yoshikawa et al. |
| 2008/0052896 A1 | 3/2008 | Tsuchiya et al. |
| 2008/0054897 A1 | 3/2008 | Crolly et al. |
| 2008/0070063 A1 | 3/2008 | Ibusuki et al. |
| 2008/0180863 A1 | 7/2008 | Gill |
| 2008/0274270 A1 | 11/2008 | Wakui et al. |
| 2009/0027813 A1 | 1/2009 | Carey et al. |
| 2010/0141251 A1 | 6/2010 | Ando et al. |
| 2011/0043201 A1 | 2/2011 | Zhou |
| 2011/0121826 A1 | 5/2011 | Engel et al. |
| 2012/0062224 A1 | 3/2012 | Ide et al. |
| 2012/0306491 A1 | 12/2012 | Ide et al. |

FOREIGN PATENT DOCUMENTS

| | | |
|---|---|---|
| JP | 8-179023 | 7/1996 |
| JP | 8-211138 | 8/1996 |
| JP | 2000-516714 | 12/2000 |
| JP | 2004-132790 | 4/2004 |
| JP | 2006-125962 | 5/2006 |
| JP | 2007-147460 | 6/2007 |
| JP | 2007-248054 | 9/2007 |
| JP | 2007-263654 | 10/2007 |
| JP | 2008-516255 | 5/2008 |
| JP | 2008-151528 | 7/2008 |
| JP | 2008-275321 | 11/2008 |
| JP | 2008-275566 | 11/2008 |
| JP | 2008-286739 | 11/2008 |
| JP | 2008-306112 | 12/2008 |
| JP | 2009-180604 | 8/2009 |
| JP | 2009-180608 | 8/2009 |
| JP | 2010-14686 | 1/2010 |
| WO | WO 98/07165 | 2/1998 |

OTHER PUBLICATIONS

Search Report dated May 24, 2011 from International Application No. PCT/JP2011/054082.
Office Action dated Jul. 24, 2013 from U.S. Appl. No. 13/917,525.
U.S. Appl. No. 13/917,525, filed Jun. 13, 2013.
Search Report dated Aug. 17, 2010 from International Application No. PCT/JP2010/059791.
Parkin, "Spin Dependent Transport in Magnetic Nanostructures", Ch. 5, pp. 237-277, 2002.
Office Action dated Jul. 11, 2013 from U.S. Appl. No. 13/300,064.
International Search Report dated May 31, 2011 from International Application No. PCT/JP2011/055185.
Search Report dated Aug. 17, 2010 from International Application No. PCT/JP2010/059959.

MAGNETIC SENSOR AND MAGNETIC BALANCE TYPE CURRENT SENSOR UTILIZING SAME

CLAIM OF PRIORITY

This application is a Continuation of International Application No. PCT/JP2011/055185 filed on Mar. 7, 2011, which claims benefit of Japanese Patent Application No. 2010-056156 filed on Mar. 12, 2010. The entire contents of each application noted above are hereby incorporated by reference.

BACKGROUND OF THE INVENTION

1. Field of the Invention

The present invention relates to a magnetic sensor and a magnetic balance type current sensor utilizing the magnetic sensor.

2. Description of the Related Art

In an electric vehicle, a motor is driven using electricity generated by an engine, and the intensity of the current for driving the motor is detected by, for example, a current sensor. The current sensor includes a magnetic core disposed around a conductor and having a cutaway portion (core gap) formed at a portion thereof, and a magnetic detecting element disposed within the core gap.

As the magnetic detecting element of the current sensor, a magnetoresistance effect element (GMR element or TMR element) including a laminate structure having a fixed magnetic layer with a fixed magnetization direction, a non-magnetic layer, and a free magnetic layer with a magnetization direction varying with respect to an external magnetic field, or the like is used. In such a current sensor, a full-bridge circuit is configured using a magnetoresistance effect element and a fixed resistance element. In this case, it has been disclosed that a fixed resistance element of a type is used that includes a film configuration where the lamination order of a free magnetic layer and a non-magnetic layer of a magnetoresistance effect element is changed, the fixed resistance element fixing the magnetization of a ferromagnetic layer using an antiferromagnetic material. Such a technique is disclosed in Japanese Unexamined Patent Application Publication No. 2007-248054 or Japanese Unexamined Patent Application Publication No. 2007-263654. By adopting such a configuration, it may be possible to cause electrical resistances or temperature coefficient resistivities (TCRs) of the magnetoresistance effect element and the fixed resistance element to coincide with each other and it may be possible to obtain a certain level of a stable output characteristic even if an ambient temperature has changed.

SUMMARY OF THE INVENTION

In a fixed resistance element in Japanese Unexamined Patent Application Publication No. 2007-248054 or Japanese Unexamined Patent Application Publication No. 2007-263654, using an antiferromagnetic material, upper and lower ferromagnetic films (Pin1, Pin2) are antiferromagnetically coupled to each other owing to an Ru film (antiparallel coupling film) whose film thickness is 0.75 nm to 0.95 nm (a second peak). In this case, since the film thickness of the second peak is used for the Ru used for an antiparallel coupling film, it may be difficult to sufficiently increase antiferromagnetic coupling between the Pin1 and the Pin2. Accordingly, it may be easy for the Pin1 and the Pin2 to move owing to an external magnetic field, and it may be easy for an anisotropic magnetoresistance effect (AMR effect) to occur. It may be ideal that the resistance value of the fixed resistance element remains constant even if the external magnetic field has changed, and if the AMR effect is large, it may be difficult to obtain a sufficiently stable output characteristic. Therefore, a magnetic sensor is desired that is capable of suppressing the AMR effect occurring owing to the external magnetic field.

In view of the above-mentioned point, the present invention is made and provides a magnetic sensor capable of suppressing the occurrence of an AMR effect due to a fixed resistance element and a magnetic balance type current sensor capable of obtaining a sufficiently stable output characteristic when an ambient temperature has changed.

A magnetic sensor of the present invention includes a magnetoresistance effect element whose resistance value changes owing to application of an induction magnetic field from a current to be measured, and a fixed resistance element, wherein the fixed resistance element includes a self-pinned type ferromagnetic fixed layer configured to be formed by causing a first ferromagnetic film and a second ferromagnetic film to be antiferromagnetically coupled to each other via an antiparallel coupling film, the antiparallel coupling film is an Ru film having the thickness of the first peak of an antiferromagnetic coupling effect, and a difference in magnetization amount between the first ferromagnetic film and the second ferromagnetic film is substantially zero.

According to this configuration, since the antiparallel coupling film of the self-pinned type ferromagnetic fixed layer is the Ru film having the thickness of the first peak of the antiferromagnetic coupling effect and a difference in magnetization amount between the first ferromagnetic film and the second ferromagnetic film is substantially zero, it may be possible to suppress the occurrence of an AMR effect due to a fixed resistance element.

In the magnetic sensor of the present invention, it is desirable that the magnetoresistance effect element includes a self-pinned type ferromagnetic fixed layer configured to be formed by causing a first ferromagnetic film and a second ferromagnetic film to be antiferromagnetically coupled to each other via an antiparallel coupling film, a non-magnetic intermediate layer, and a soft magnetic free layer, wherein the first ferromagnetic film and the second ferromagnetic film are approximately equal in Curie temperature to each other and a difference in magnetization amount therebetween is substantially zero.

In the magnetic sensor of the present invention, it is desirable that the first ferromagnetic film is formed using CoFe alloy including Fe of 40 atomic percent to 80 atomic percent and the second ferromagnetic film is formed using CoFe alloy including Fe of 0 atomic percent to 40 atomic percent.

A magnetic balance type current sensor of the present invention includes the above-mentioned magnetic sensor and includes a magnetic field detection bridge circuit configured to provide two outputs causing a voltage difference according to the induction magnetic field, a feedback coil configured to be disposed in the vicinity of the magnetoresistance effect element and generate a cancelling magnetic field for cancelling out the induction magnetic field, and a magnetic shield configured to attenuate the induction magnetic field and enhance the cancelling magnetic field, wherein the current to be measured is measured on the basis of a current flowing in the feedback coil when the feedback coil has been energized owing to the voltage difference and an equilibrium state where the induction magnetic field and the cancelling magnetic field cancel each other out has occurred.

According to this configuration, since a magnetic sensor suppressing the occurrence of the AMR effect is used, it may be possible to obtain a sufficiently stable output characteristic.

In the magnetic balance type current sensor of the present invention, it is desirable that the feedback coil, the magnetic shield, and the magnetic field detection bridge circuit are formed on a same substrate.

In the magnetic balance type current sensor of the present invention, it is desirable that the feedback coil is disposed between the magnetic shield and the magnetic field detection bridge circuit and the magnetic shield is disposed on a side near the current to be measured.

In the magnetic balance type current sensor of the present invention, it is desirable that the magnetoresistance effect element has a shape in which a plurality of belt-like elongated patterns, disposed so that longitudinal directions thereof are parallel to one another, are folded and the induction magnetic field and the cancelling magnetic field are applied so as to be headed in a direction perpendicular to the longitudinal direction.

In the magnetic balance type current sensor of the present invention, it is desirable that the magnetic shield is formed using a high magnetic permeability material selected from a group including an amorphous magnetic material, a permalloy-based magnetic material, and an iron-based microcrystalline material.

DESCRIPTION OF THE PREFERRED EMBODIMENTS

Figure 1:
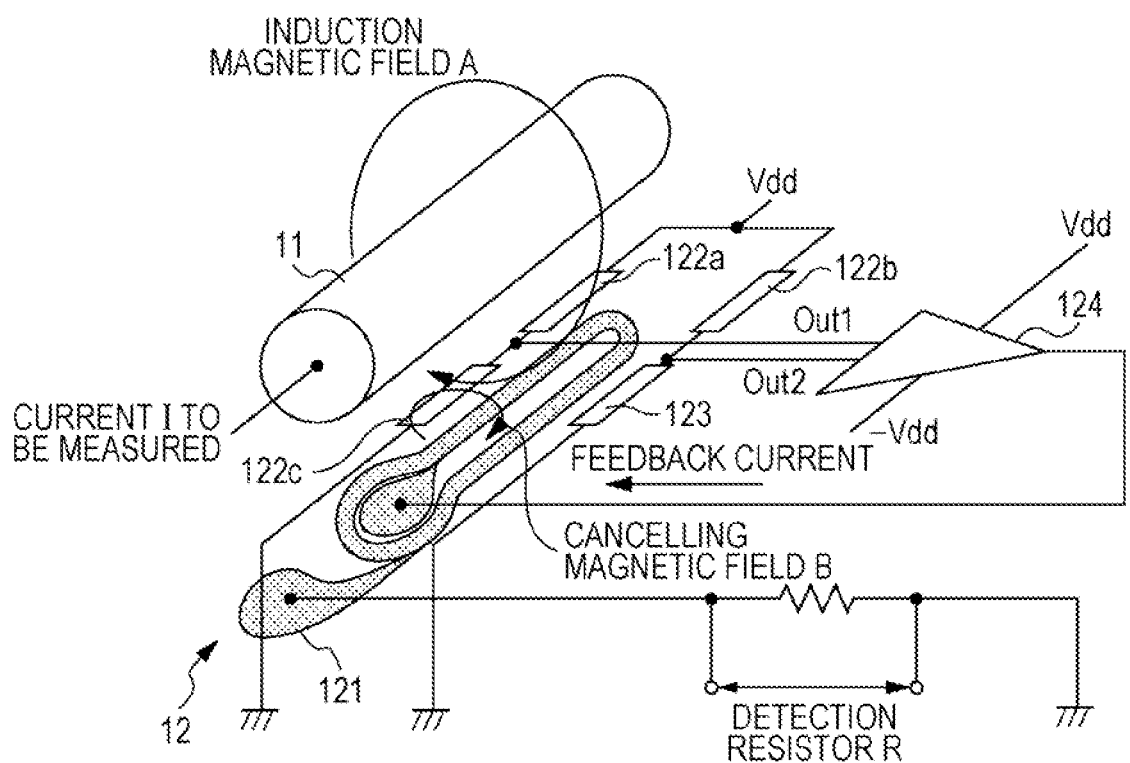
FIG. 1 is a diagram illustrating a magnetic balance type current sensor according to an embodiment of the present invention.
Figure 2A:
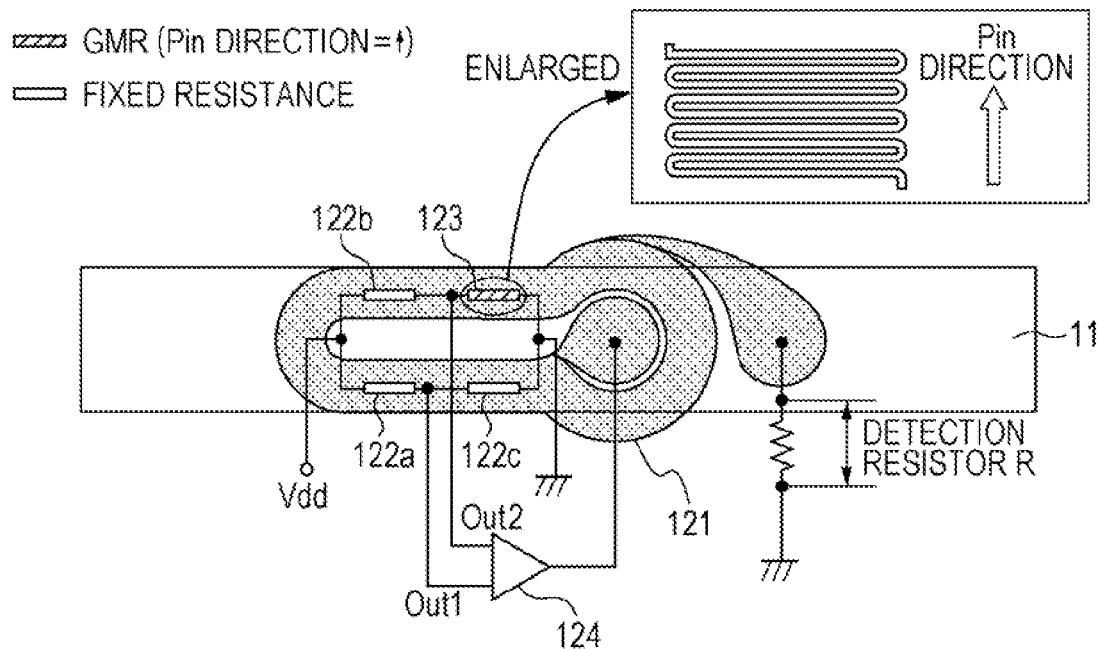
FIG. 2A is a diagram illustrating a magnetic balance type current sensor according to an embodiment of the present invention.

Hereinafter, embodiments of the present invention will be described in detail with reference to accompanying drawings. FIG. 1 and FIG. 2A are diagrams illustrating a magnetic balance type current sensor according to an embodiment of the present invention. In the present embodiment, the magnetic balance type current sensor illustrated in FIG. 1 and FIG. 2A is installed adjacent to a conductor 11 in which a current Ito be measured flows. The magnetic balance type current sensor includes a feedback circuit 12 for causing a magnetic field (cancelling magnetic field) for cancelling out an induction magnetic field due to the current Ito be measured which flows in the conductor 11. The feedback circuit 12 has a feedback coil 121, wound in a direction for cancelling out a magnetic field generated owing to the current Ito be measured, three fixed resistance elements 122a to 122c, and one magnetoresistance effect element 123.

The feedback coil 121 is configured using a planar coil. Since the configuration does not have a magnetic core, it may be possible to manufacture the feedback coil at low cost. In addition, as compared with a case of a toroidal coil, it may be possible to prevent the cancelling magnetic field, which is generated from the feedback coil, from extensively spreading, and to prevent it from influencing a peripheral circuit. Furthermore, as compared with the case of the toroidal coil, if the current to be measured is an alternating current, the control of the cancelling magnetic field by the feedback coil is easy, and a current flowing for the control is not particularly increased. These effects become greater as the current to be measured, which is an alternating current, becomes a high frequency. In the case where the feedback coil 121 is configured using the planar coil, it is desirable that the planar coil is provided so that both the induction magnetic field and the cancelling magnetic field are generated in a plane parallel to the forming surface of the planar coil.

The resistance value of the magnetoresistance effect element 123 changes owing to the application of the induction magnetic field from the current Ito be measured. The one magnetoresistance effect element 123 and the fixed resistance elements 122a to 122c configure a magnetic field detection bridge circuit. It may be possible to realize a highly-sensitive magnetic balance type current sensor using the magnetic field detection bridge circuit including the magnetoresistance effect element in this way.

Figure 2B:
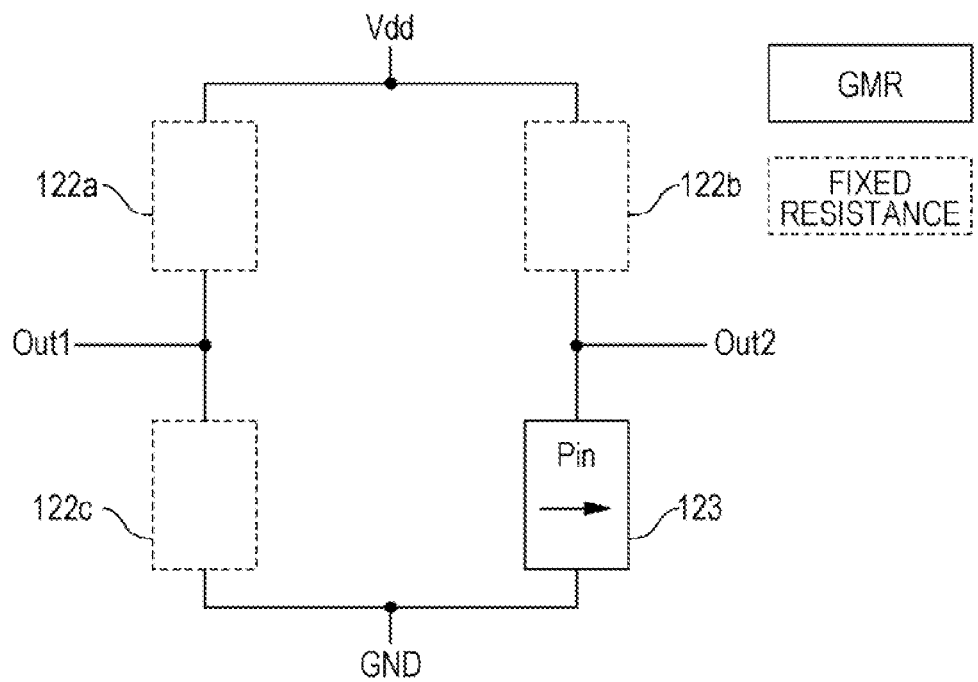
FIG. 2B is a diagram illustrating a magnetic detecting bridge circuit in the magnetic balance type current sensor illustrated in FIG. 2A.

The magnetic field detection bridge circuit includes two outputs for causing a voltage difference according to the induction magnetic field generated owing to the current Ito be measured. In the magnetic field detection bridge circuit illustrated in FIG. 2B, a power source Vdd is connected to a connection point between the fixed resistance elements 122a and 122b, and a ground (GND) is connected to a connection point between the fixed resistance element 122c and the magnetoresistance effect element 123. Furthermore, in the magnetic field detection bridge circuit, one output (Out1) is taken from a connection point between the fixed resistance elements 122a and 122c, and the other output (Out2) is taken from a connection point between the fixed resistance element 122b and the magnetoresistance effect element 123. These two outputs are amplified by an amplifier 124, and then are applied to the feedback coil 121 as a current (feedback current). The feedback current corresponds to a voltage difference according to the induction magnetic field. At this time, the cancelling magnetic field for cancelling out the induction magnetic field is generated in the feedback coil 121. In addition, the current to be measured is measured by a detection unit (detection resistor R) on the basis of the current flowing in the feedback coil 121 at the time of an equilibrium state in which the induction magnetic field and the cancelling magnetic field cancel each other out.

Figure 3:
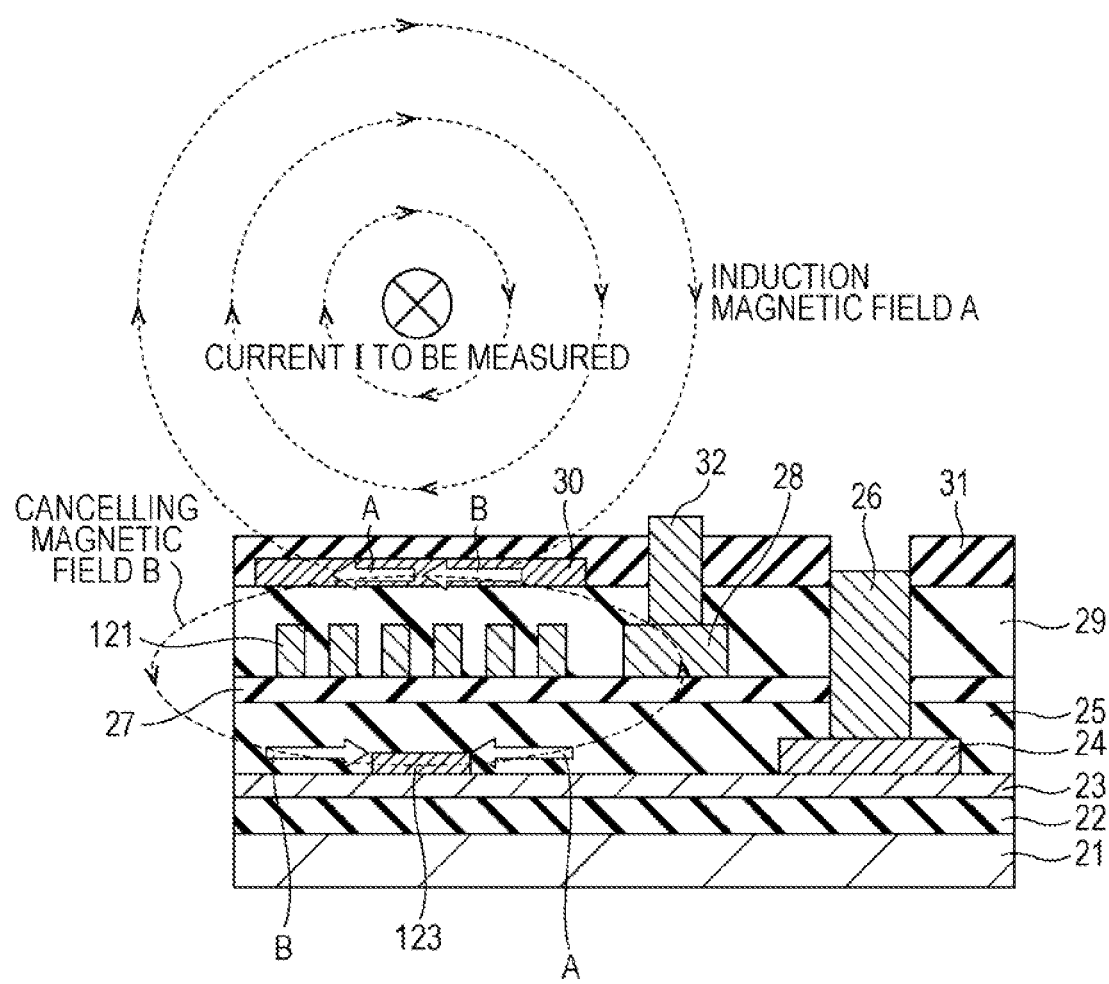
FIG. 3 is a cross-sectional view illustrating the magnetic balance type current sensor illustrated in FIG. 1.

FIG. 3 is a cross-sectional view illustrating the magnetic balance type current sensor illustrated in FIG. 1. As illustrated in FIG. 3, in the magnetic balance type current sensor according to the present embodiment, the feedback coil, the magnetic shield, and the magnetic field detection bridge circuit are formed on a same substrate 21. In the configuration illustrated in FIG. 3, the feedback coil is disposed between the magnetic shield and the magnetic field detection bridge circuit, and the magnetic shield is disposed on a side near the current Ito be measured. Namely, the magnetic shield, the feedback coil, and the magnetoresistance effect element are disposed in this order from a side near the conductor 11. Accordingly, it may be possible to cause the magnetoresistance effect element to be farthest away from the conductor 11, and it may be possible to reduce the induction magnetic field applied to the magnetoresistance effect element from the current I to be measured. In addition, since it may be possible to cause the magnetic shield to be nearest to the conductor 11, it may be possible to further improve the attenuation effect of the induction magnetic field. Accordingly, it may be possible to reduce the cancelling magnetic field from the feedback coil.

The layer configuration illustrated in FIG. 3 will be described in detail. In the magnetic balance type current sensor illustrated in FIG. 3, a thermal silicon oxide film 22 serving as an insulating layer is formed on the substrate 21. An aluminum oxide film 23 is formed on the thermal silicon oxide film 22. For example, it may be possible to form the aluminum oxide film 23 as a film by a method such as sputtering. In addition, a silicon substrate or the like is used as the substrate 21.

The fixed resistance elements 122a to 122c and the magnetoresistance effect element 123 are formed on the aluminum oxide film 23 to form a magnetic field detection bridge circuit. As the magnetoresistance effect element 123, a TMR element (tunnel-type magnetoresistance effect element), a GMR element (giant magnetoresistance effect element), or the like may be used. The film configurations of the magnetoresistance effect element and the fixed resistance element, used in the magnetic balance type current sensor according to the present invention, will be described below.

As the magnetoresistance effect element, as illustrated in the enlarged view of FIG. 2A, a GMR element having a shape (meander shape) is desirable, in which a plurality of belt-like elongated patterns (stripes), disposed so that the longitudinal directions thereof are parallel to one another, are folded. In the meander shape, a sensitivity axis direction (Pin direction) is a direction (stripe width direction) perpendicular to the longitudinal direction (stripe longitudinal direction) of the elongated pattern. In the meander shape, the induction magnetic field and the cancelling magnetic field are applied so as to be headed in a direction (stripe width direction) perpendicular to the stripe longitudinal direction.

Considering linearity in the meander shape, it is desirable that the width of the meander shape in a Pin direction is 1 μm to 10 μm. In this case, considering the linearity, it is desirable that the longitudinal direction is perpendicular to both the direction of the induction magnetic field and the direction of the cancelling magnetic field. By adopting such a meander shape, it may be possible to obtain the output of the magnetoresistance effect element with fewer terminals (two terminals) than Hall elements.

In addition, an electrode 24 is formed on the aluminum oxide film 23. The electrode 24 may be formed by photolithography and etching after an electrode material has been formed as a film.

On the aluminum oxide film 23 in which the fixed resistance elements 122a to 122c, the magnetoresistance effect element 123, and the electrode 24 are formed, a polyimide layer 25 is formed as an insulating layer. The polyimide layer 25 may be formed by applying and curing a polyimide material.

A silicon oxide film 27 is formed on the polyimide layer 25. For example, the silicon oxide film 27 may be formed as a film using a method such as sputtering.

The feedback coil 121 is formed on the silicon oxide film 27. The feedback coil 121 may be formed by photolithography and etching after a coil material has been formed as a film. Alternatively, the feedback coil 121 may be formed by photolithography and plating after a base material has been formed as a film.

In addition, a coil electrode 28 is formed on the silicon oxide film 27 in the vicinity of the feedback coil 121. The coil electrode 28 may be formed by photolithography and etching after an electrode material has been formed as a film.

On the silicon oxide film 27 on which the feedback coil 121 and the coil electrode 28 are formed, a polyimide layer 29 is formed as an insulating layer. The polyimide layer 29 may be formed by applying and curing a polyimide material.

A magnetic shield 30 is formed on the polyimide layer 29. As the configuration material of the magnetic shield 30, a high magnetic permeability material such as an amorphous magnetic material, a permalloy-based magnetic material, or an iron-based microcrystalline material may be used.

A silicon oxide film 31 is formed on the polyimide layer 29. The silicon oxide film 31 may be formed as a film using a method such as, for example, sputtering. Contact holes are formed in predetermined regions of the polyimide layer 29 and the silicon oxide film 31 (a region of the coil electrode 28 and a region of the electrode 24), and electrode pads 32 and 26 are formed in the respective contact holes. The contact holes are formed using photolithography and etching, or the like.

The electrode pads 32 and 26 may be formed by photolithography and plating after an electrode material has been formed as a film.

In the magnetic balance type current sensor including such a configuration as described above, as illustrated in FIG. 3, the magnetoresistance effect element receives the induction magnetic field A generated from the current Ito be measured, and then the induction magnetic field is fed back to generate the cancelling magnetic field B from the feedback coil 121. In addition to this, two magnetic fields (the induction magnetic field A and the cancelling magnetic field B) are appropriately adjusted in such a way that the magnetic fields are cancelled out, thereby causing a magnetizing field applied to the magnetoresistance effect element 121 to be zero.

The magnetic balance type current sensor according to the present invention includes the magnetic shield 30 adjacent to the feedback coil 121, as illustrated in FIG. 3. It may be possible for the magnetic shield 30 to attenuate the induction magnetic field, generated from the current Ito be measured and applied to the magnetoresistance effect element (the direction of the induction magnetic field A and the direction of the cancelling magnetic field B are directions opposite to each other in the magnetoresistance effect element), and enhance the cancelling magnetic field B from the feedback coil 121 (the direction of the induction magnetic field A and the direction of the cancelling magnetic field B are the same direction in the magnetic shield). Accordingly, since the magnetic shield 30 functions as a magnetic yoke, it may be possible to reduce the current flowing in the feedback coil 121 and achieve electric power saving. In addition, it may be possible to reduce the influence of the external magnetic field owing to the magnetic shield 30.

The magnetic balance type current sensor including such a configuration as described above utilizes the magnetic field detection bridge circuit including, as the magnetic detecting element, the magnetoresistance effect element, in particular, the GMR element or the TMR element. Accordingly, it may be possible to realize a highly-sensitive magnetic balance type current sensor. In addition, in the magnetic balance type current sensor including the above-mentioned configuration, since the feedback coil 121, the magnetic shield 30, and the magnetic field detection bridge circuit are formed on the same substrate, it may be possible to achieve downsizing. Furthermore, since the magnetic balance type current sensor does not include a magnetic core, it may be possible to achieve downsizing and cost reduction.

Figure 4:
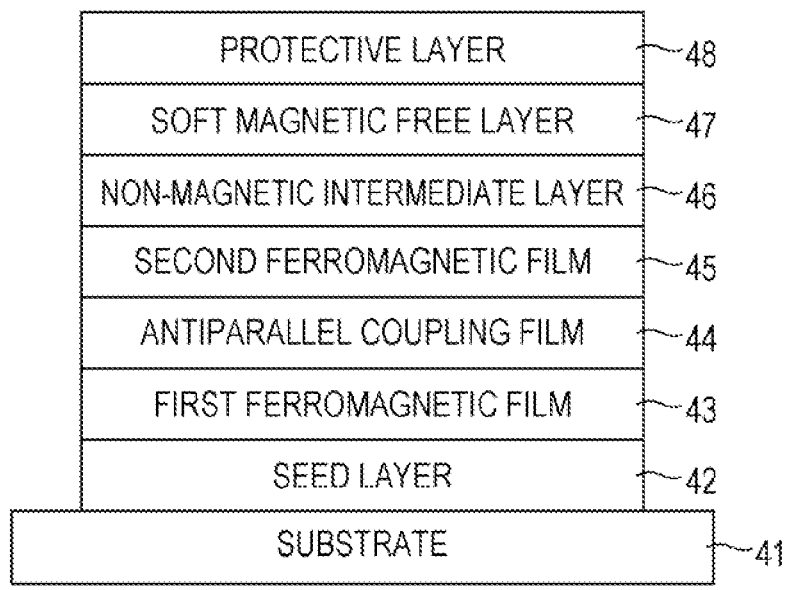
FIG. 4 is a diagram illustrating an example of a film configuration of a magnetoresistance effect element in a magnetic sensor according to the present invention.

The film configuration of the magnetoresistance effect element used in the present invention is illustrated, for example, in FIG. 4. Namely, the magnetoresistance effect element includes the laminate structure provided in the substrate 41, as illustrated in FIG. 4. In addition, in FIG. 4, for ease of explanation, a base layer and the like other than the magnetoresistance effect element are omitted in the substrate 41, and illustration is performed. The magnetoresistance effect element includes a seed layer 42, a first ferromagnetic film 43, an antiparallel coupling film 44, a second ferromagnetic film 45, a non-magnetic intermediate layer 46, a soft magnetic free layer (free magnetic layer) 47, and a protective layer 48. In the magnetoresistance effect element, the first ferromagnetic film 43 is Pin1, and the second ferromagnetic film 45 is Pin2.

The seed layer 42 is formed using NiFeCr, Cr, or the like. The protective layer 48 is formed using Ta or the like. In addition, in the above-mentioned laminate structure, a base layer formed using a non-magnetic material, such as at least one element of, for example, Ta, Hf, Nb, Zr, Ti, Mo, and W, may be provided between the substrate 41 and the seed layer 42.

In the magnetoresistance effect element, the first ferromagnetic film 43 and the second ferromagnetic film 45 are antiferromagnetically coupled to each other via the antiparallel coupling film 44 therebetween, thereby configuring a so-called self-pinned type ferromagnetic fixed layer (SFP: Synthetic Ferri Pinned layer).

In the ferromagnetic fixed layer, the thickness of the antiparallel coupling film 44 is set to 0.3 nm to 0.45 nm, or 0.75 nm to 0.95 nm, and hence, it may be possible to achieve a strong antiferromagnetic coupling between the first ferromagnetic film 43 and the second ferromagnetic film 45.

In addition, the magnetization amount (Ms·t) of the first ferromagnetic film 43 and the magnetization amount (Ms·t) of the second ferromagnetic film 45 are substantially equal to each other. Namely, a difference in magnetization amount between the first ferromagnetic film 43 and the second ferromagnetic film 45 is substantially zero. Therefore, the effective anisotropic magnetic field of the SFP layer is large. Accordingly, even if an antiferromagnetic material is not used, it may be possible to sufficiently ensure the magnetization stability of the ferromagnetic fixed layer (Pin layer). This is because when it is assumed that the film thickness of the first ferromagnetic film is t1, the film thickness of the second ferromagnetic film is t2, and magnetization and an induced magnetic anisotropic constant per unit volume of both layers are Ms and K, respectively, the effective anisotropic magnetic field of the SFP layer is represented by the following Expression (1).

$$eff HK = 2(K \cdot t1 + K \cdot t2)/(Ms \cdot t1 - Ms \cdot t2) \quad \text{Expression (1)}$$

Accordingly, the magnetoresistance effect element used in the magnetic balance type current sensor of the present invention includes a film configuration with no antiferromagnetic layer.

A Curie temperature (Tc) of the first ferromagnetic film 43 and a Curie temperature (Tc) of the second ferromagnetic film 45 are approximately equal to each other. Accordingly, a difference in magnetization amount (Ms·t) between the two films 43 and 45 under a high-temperature environment also becomes about zero, and hence, it may be possible to maintain the high magnetization stability.

It is desirable that the first ferromagnetic film 43 is formed using CoFe alloy containing Fe of 40 atomic percent to 80 atomic percent. The reason is that the CoFe alloy of the composition range has a high coercive force, and may reliably maintain the magnetization with respect to the external magnetizing field. In addition, it is desirable that the second ferromagnetic film 45 is formed using CoFe alloy containing Fe of 0 atomic percent to 40 atomic percent. The reason is that the CoFe alloy of the composition range has a low coercive force, and may be easily magnetized in a direction antiparallel to (direction different by 180 degrees from) a direction in which the first ferromagnetic film 43 is preferentially magnetized. As a result, it may be possible to further increase Hk indicated by the Expression (1). In addition, by limiting the second ferromagnetic film 45 to this composition range, it may be possible to increase the resistance change rate of the magnetoresistance effect element.

It is desirable that, in the first ferromagnetic film 43 and the second ferromagnetic film 45, a magnetizing field is applied in the stripe width direction of the meander shape during the film formation thereof and induced magnetic anisotropy is added to the first ferromagnetic film 43 and the second ferromagnetic film 45 after the film formation. Accordingly, both the films 43 and 45 are magnetized antiparallel to the stripe width direction. In addition, since the magnetization directions of the first ferromagnetic film 43 and the second ferromagnetic film 45 are determined by the application direction of a magnetizing field at the time of the film formation of the first ferromagnetic film 43, it may be possible to form a plurality of magnetoresistance effect elements having ferromagnetic fixed layers whose magnetization directions are different from one another, on the same substrate by changing the application direction of the magnetizing field at the time of the film formation of the first ferromagnetic film 43.

The antiparallel coupling film 44 in a ferromagnetic fixed layer is formed using Ru or the like. In addition, the soft magnetic free layer (free layer) 47 is formed using a magnetic material such as a CoFe alloy, a NiFe alloy, or a CoFeNi alloy. In addition, the nonmagnetic intermediate layer 46 is formed using Cu or the like. In addition, it is desirable that, in the soft magnetic free layer 47, a magnetizing field is applied in the stripe longitudinal direction of the meander shape during the film formation thereof and induced magnetic anisotropy is added to the soft magnetic free layer 47 after the film formation. Accordingly, in the magnetoresistance effect element, resistance linearly changes with respect to an external magnetizing field (magnetizing field from a current to be measured) in the stripe width direction, and it may be possible to reduce hysteresis. In such a magnetoresistance effect element, owing to the ferromagnetic fixed layer, the non-magnetic intermediate layer, and the soft magnetic free layer, a spin-valve configuration is adopted.

Figure 8:
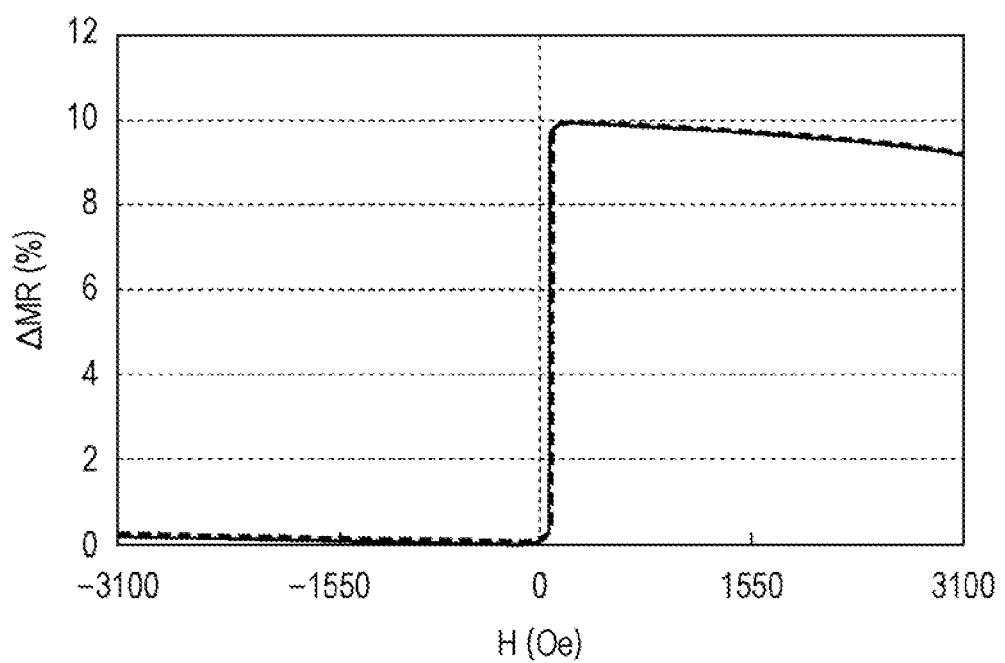
FIG. 8 is a diagram illustrating an R-H curved line of a magnetoresistance effect element in a magnetic balance type current sensor according to an embodiment of the present invention.

An example of the film configuration of the magnetoresistance effect element used in the magnetic balance type current sensor of the present invention includes, for example, NiFeCr (seed layer: 5 nm), Fe70Co30 (first ferromagnetic film: 1.65 nm), Ru (antiparallel coupling film: 0.4 nm), Co90Fe10 (second ferromagnetic film: 2 nm), Cu (non-magnetic intermediate layer: 2.2 nm), Co90Fe10 (soft magnetic free layer: 1 nm), NiFe (soft magnetic free layer: 7 nm), and Ta (protective layer: 5 nm). When an R-H waveform was studied with respect to the magnetoresistance effect element of such a film configuration, such a result as illustrated in FIG. 8 was obtained and it was understood that the same characteristic as the R-H waveform of a magnetoresistance effect element of a type that fixes the magnetization of a fixed magnetic layer using an antiferromagnetic film was obtained. In addition, the R-H waveform illustrated in FIG. 8 was obtained under the condition of normal measurement.

Figure 5:
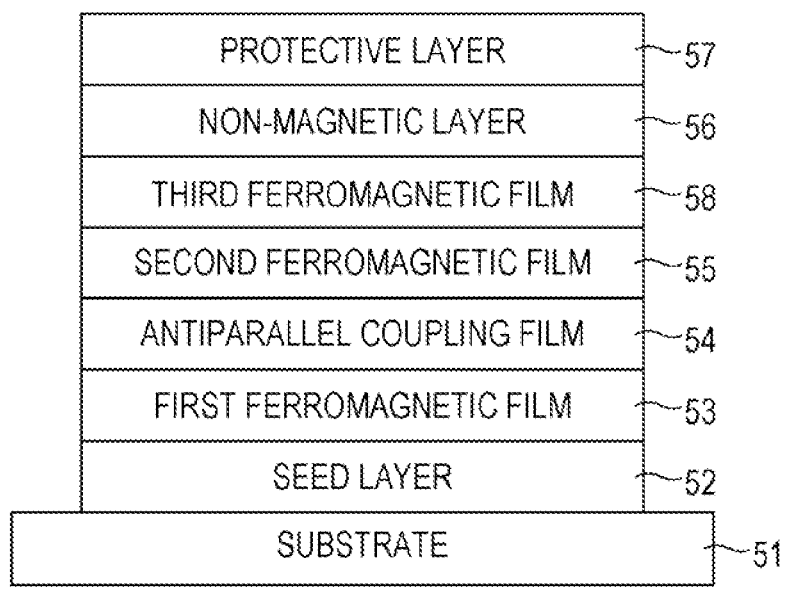
FIG. 5 is a diagram illustrating an example of a film configuration of a fixed resistance element in a magnetic sensor according to the present invention.

The film configuration of a fixed resistance element used in the present invention is illustrated in FIG. 5, for example. Namely, as illustrated in FIG. 5, the fixed resistance element includes a laminate structure provided in a substrate 51. In addition, in FIG. 5, for ease of explanation, a base layer and the like other than the fixed resistance element are omitted in the substrate 51, and illustration is performed. The fixed resistance element includes a seed layer 52, a first ferromagnetic film 53, an antiparallel coupling film 54, a second ferromagnetic film 55, a third ferromagnetic film 58, a non-magnetic layer 56, and a protective layer 57. In the fixed resistance element, the first ferromagnetic film 53 is the Pin1, and the second ferromagnetic film 55 is the Pin2.

Namely, it may be possible to simultaneously or sequentially form the seed layer 52, the first ferromagnetic film 53, the antiparallel coupling film 54, and the second ferromagnetic film 55 in the same processes as the seed layer, the first ferromagnetic film, the antiparallel coupling film, and the second ferromagnetic film in the magnetoresistance effect element. In addition, in place of forming the non-magnetic intermediate layer on the second ferromagnetic film in the magnetoresistance effect element, the third ferromagnetic film 58 corresponding to the soft magnetic free layer 47 is provided, the non-magnetic layer 56 is formed thereon, and the protective layer 57 is formed. Alternatively, while the third ferromagnetic film 58 is not provided on the second ferromagnetic film, the non-magnetic layer 56 is formed, and the protective layer 57 is formed. In the fixed resistance element of such a configuration as described above, since the lamination order of the free magnetic layer and the non-magnetic layer of the magnetoresistance effect element is changed or no free magnetic layer exists, it is difficult for the GMR effect to occur, and a fixed layer is obtained.

The seed layer 52 is formed using NiFeCr, Cr, or the like. The protective layer 57 is formed using Ta or the like. In addition, in the above-mentioned laminate structure, a base layer formed using a non-magnetic material, such as at least one element of, for example, Ta, Hf, Nb, Zr, Ti, Mo, and W, may be provided between the substrate 51 and the seed layer 52. In addition, the non-magnetic film 56 is formed using Cu or the like.

In the fixed resistance element, the first ferromagnetic film 53 and the second ferromagnetic film 55 are antiferromagnetically coupled to each other via the antiparallel coupling film 54 therebetween, thereby configuring a so-called self-pinned type ferromagnetic fixed layer (SFP: Synthetic Ferri Pinned layer).

In the ferromagnetic fixed layer, it is assumed that the antiparallel coupling film 54 is an Ru film having the thickness of 0.3 nm to 0.45 nm serving as the thickness of the first peak of an antiferromagnetic coupling effect. Accordingly, it may be possible to achieve a strong antiferromagnetic coupling between the first ferromagnetic film 53 and the second ferromagnetic film 55.

In the same way as the fixed resistance element of the related art, using an antiferromagnetic material and an Ru film having the thickness of 0.3 nm to 0.45 nm, it may be possible to strengthen an antiferromagnetic coupling between the first ferromagnetic film 53 and the second ferromagnetic film 55. In this case, when annealing is performed for the sake of the exchange coupling of the antiferromagnetic layer and the first ferromagnetic film 53, it may be necessary to apply enough magnetic field to completely saturate both the first ferromagnetic film 53 and the second ferromagnetic film 55, in order to suppress the magnetization dispersion of the first ferromagnetic film 53 and the second ferromagnetic film 55 and align magnetization directions. However, when the antiparallel coupling film 54 is the Ru film of the first peak, the above-mentioned saturation magnetic field becomes a very large value (for example, greater than or equal to 3 T). Accordingly, there occurs a problem that an expensive device capable of performing annealing with applying a strong magnetizing field is necessary. In addition, while, so as to generate a sufficient exchange-coupling magnetic field, an annealing temperature of about 300° C. is desirable, if such a high-temperature heat treatment is performed on a laminate film having the Ru film having the thickness of 0.3 nm to 0.45 nm, the antiferromagnetic coupling of the first ferromagnetic film 53 and the second ferromagnetic film 55 is deteriorated owing to the interlayer diffusion of Ru, and as a result, it may be easy for the first ferromagnetic film 53 and the second ferromagnetic film 55 to move owing to an external magnetic field, and it may be easy for the AMR effect to occur.

In the magnetic sensor according to the present invention, a difference in Ms·t between the ferromagnetic films 55 and 53 above and below the Ru film is substantially zero. In addition, since this magnetic sensor includes no antiferromagnetic layer, such annealing treatment as described above may be unnecessary. Therefore, since there is no concern that the thermal diffusion of Ru occurs owing to the high temperature treatment, it may be possible to use, as the antiparallel coupling film 54, the Ru film having the thickness of 0.3 nm to 0.45 nm serving as the thickness of the first peak of the antiferromagnetic coupling effect. Accordingly, as illustrated in the above-mentioned Expression, it may be possible to increase the anisotropic magnetic field of the first ferromagnetic film 53 or the second ferromagnetic film 55 in the fixed resistance element. As a result, since the magnetization change of the first ferromagnetic film 53 or the second ferromagnetic film 55 becomes very small with respect to an external magnetic field, it may be possible to cause the AMR effect to be very close to zero. As a result, in the magnetic balance type current sensor utilizing such a magnetic sensor as described above, it may be possible to obtain a more stable output characteristic than the magnetic balance type current sensor of the related art. In addition, it may be possible to realize a coincidence in electrical resistance between the magnetoresistance effect element and the fixed resistance element by adjusting the film thickness of the non-magnetic layer, and it may be possible to realize a coincidence in TCR between the two by adjusting the film thickness of the first ferromagnetic film 53 or the second ferromagnetic film 55.

In addition, the magnetization amount (Ms·t) of the first ferromagnetic film 53 and the magnetization amount (Ms·t) of the second ferromagnetic film 55 are substantially equal to each other. Namely, a difference in magnetization amount between the first ferromagnetic film 53 and the second ferromagnetic film 55 is substantially zero. Therefore, the effective anisotropic magnetic field of the SFP layer is large. Accordingly, even if the antiferromagnetic material is not used, it may be possible to sufficiently ensure the magnetization stability of the ferromagnetic fixed layer. This is because when it is assumed that the film thickness of the first ferromagnetic film is t1, the film thickness of the second ferromagnetic film is t2, and magnetization and an induced magnetic anisotropic constant of both layers are Ms and K, respectively, the effective anisotropic magnetic field of the SFP layer is represented by the following Expression (1).

$$eff HK = 2(K \cdot t_1 + K \cdot t_2)/(Ms \cdot t_1 - Ms \cdot t_2) \quad \text{Expresion (1)}$$

Accordingly, the fixed resistance element used in the magnetic balance type current sensor of the present invention includes a film configuration with no antiferromagnetic layer.

It is desirable that the first ferromagnetic film 53 is formed using CoFe alloy containing Fe of 40 atomic percent to 80 atomic percent. The reason is that the CoFe alloy of the composition range has a high coercive force, and may reliably maintain the magnetization with respect to the external magnetizing field. In addition, it is desirable that the second ferromagnetic film 55 is formed using CoFe alloy containing Fe of 0 atomic percent to 40 atomic percent. The reason is that the CoFe alloy of the composition range has a low coercive force, and may be easily magnetized in a direction antiparallel to (direction different by 180 degrees from) a direction in which the first ferromagnetic film 53 is preferentially magnetized. As a result, it may be possible to further increase Hk indicated by the above-mentioned Expression (1). In addition, by limiting the second ferromagnetic film 55 to this composition range, it may be possible to increase the resistance change rate of the magnetoresistance effect element.

It is desirable that, in the first ferromagnetic film 53 and the second ferromagnetic film 55, a magnetizing field is applied in the stripe width direction of the meander shape during the film formation thereof and induced magnetic anisotropy is added to the first ferromagnetic film 53 and the second ferromagnetic film 55 after the film formation. Accordingly, both the films 53 and 55 are magnetized antiparallel to the stripe width direction. In addition, since the magnetization directions of the first ferromagnetic film 53 and the second ferromagnetic film 55 are determined by the application direction of a magnetizing field at the time of the film formation of the first ferromagnetic film 53, it may be possible to form a plurality of magnetoresistance effect elements having ferromagnetic fixed layers whose magnetization directions are different from one another, on the same substrate by changing the application direction of the magnetizing field at the time of the film formation of the first ferromagnetic film 53.

An example of the film configuration of the fixed resistance element used in the magnetic balance type current sensor of the present invention includes, for example, NiFeCr (seed layer: 5 nm), Fe70Co30 (first ferromagnetic film: 4 nm), Ru (antiparallel coupling film: 0.4 nm), Co90Fe10 (second ferromagnetic film: 1 nm), NiFe (second ferromagnetic film: 6 nm), Cu (non-magnetic layer: 3 nm), and Ta (protective layer: 5 nm).

Here, an embodiment will be described that was performed so as to clarify the advantageous effect to the present invention.

Figure 9A:
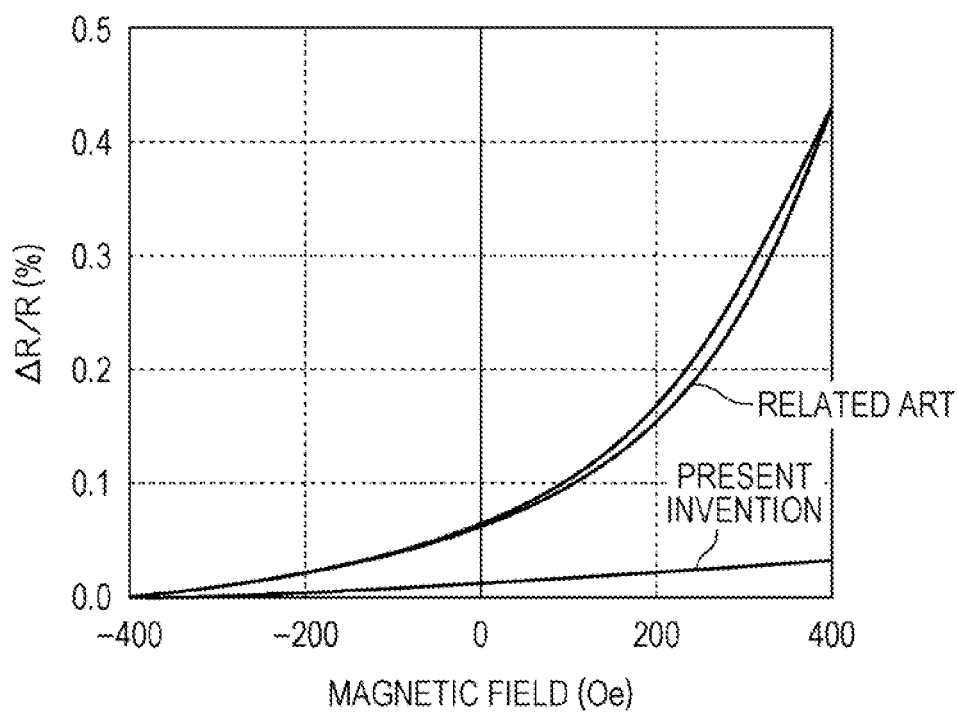
FIGS. 9A and 9B are diagrams illustrating an AMR effect of a magnetic sensor according to an embodiment of the present invention.
Figure 9B:
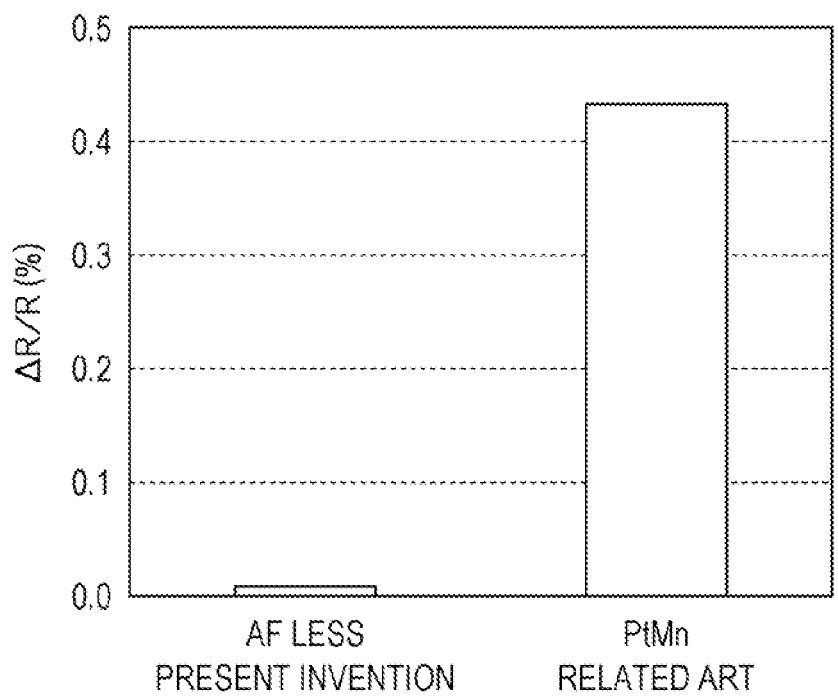

An AMR effect was studied with respect to a fixed resistance element that has a film configuration including NiFeCr (seed layer: 4.2 nm), Fe70Co30 (first ferromagnetic film: 4 nm), Ru (antiparallel coupling film: 0.38 nm), Co90Fe10 (second ferromagnetic film: 1 nm), Ni81.5Fe18.5 (second ferromagnetic film: 6 nm), Cu (non-magnetic layer: 3.5 nm), and Ta (protective layer: 8 nm) and has the size of 5 μm×200 μm. The result is illustrated in FIGS. 9A and 9B. In addition, the AMR effect was obtained by measuring a resistance change rate (ΔR/R (%)). In addition, in the same way, an AMR effect was studied with respect to a fixed resistance element that has a film configuration including NiFeCr (seed layer: 6 nm), PtMn (antiferromagnetic layer: 20 nm), Fe90Co10 (first ferromagnetic film: 1.25 nm), Ru (antiparallel coupling film: 8.5 nm), Co90Fe10 (second ferromagnetic film: 1.4 nm), Ni81.5Fe18.5 (second ferromagnetic film: 6 nm), Cu (non-magnetic layer: 3 nm), and Ta (protective layer: 8 nm) and has the size of 5 μm×200 μm. The result is illustrated side by side in FIGS. 9A and 9B.

As can be seen from FIGS. 9A and 9B, in the magnetic sensor (the present invention: AF less) according to the present invention, the AMR effect was small. On the other hand, in the magnetic sensor of the related art (related art: PtMn), the AMR effect was large. In the magnetic sensor of the related art, considering that a resistance rate is about 0.4% at a magnetic field of 400 Oe (×103/4 πA/m) and the resistance change rate of the magnetoresistance effect element is about 8%, it is a large value. In this way, according to the magnetic sensor according to the present invention, it may be possible to sufficiently reduce the AMR effect due to an external magnetic field.

In the magnetic balance type current sensor including the magnetoresistance effect element 123 including the film configuration illustrated in FIG. 4 and the fixed resistance elements 122a to 122c including the film configuration illustrated in FIG. 5, the cancelling magnetic field is applied from the feedback coil 121 to the magnetoresistance effect element so that a voltage difference between the two outputs (Out1 and Out2) of the magnetic detecting bridge circuit becomes zero, and the current to be measured is measured by detecting the value of a current flowing in the feedback coil 121 at that time.

Figure 6A:
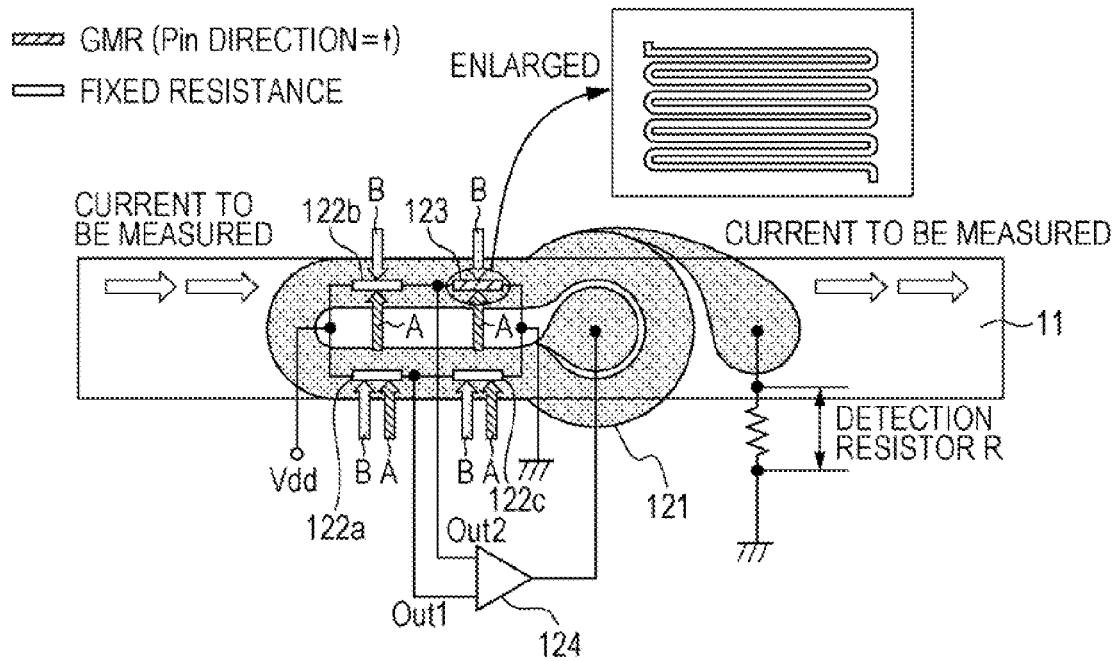
FIG. 6A is a diagram illustrating a current measurement state of the magnetic balance type current sensor illustrated in FIGS. 2A and 2B.
Figure 6B:
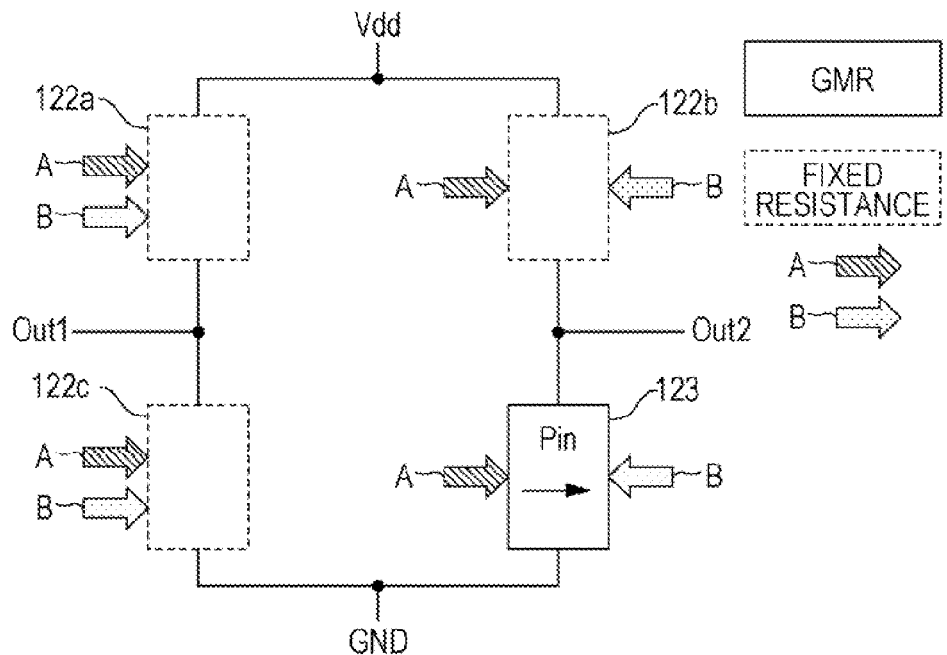
FIG. 6B is a diagram illustrating a magnetic detecting bridge circuit in the magnetic balance type current sensor illustrated in FIG. 6A.

As illustrated in FIG. 6A, if the current to be measured flows from the observers' left side of the plane of paper in FIGS. 6A and 6B, the induction magnetic field A and the cancelling magnetic field B are applied to the two fixed resistance elements 122a and 122c (on the Out1 side) in the same direction (Pin direction), as illustrated in FIGS. 6A and 6B. On the other hand, the cancelling magnetic field B is applied to the fixed resistance element 122b and the magnetoresistance effect element 123 (on the Out2 side) in a direction opposite to the Pin direction, and the induction magnetic field A is applied to the fixed resistance element 122b and the magnetoresistance effect element 123 in the Pin direction.

Figure 7A:
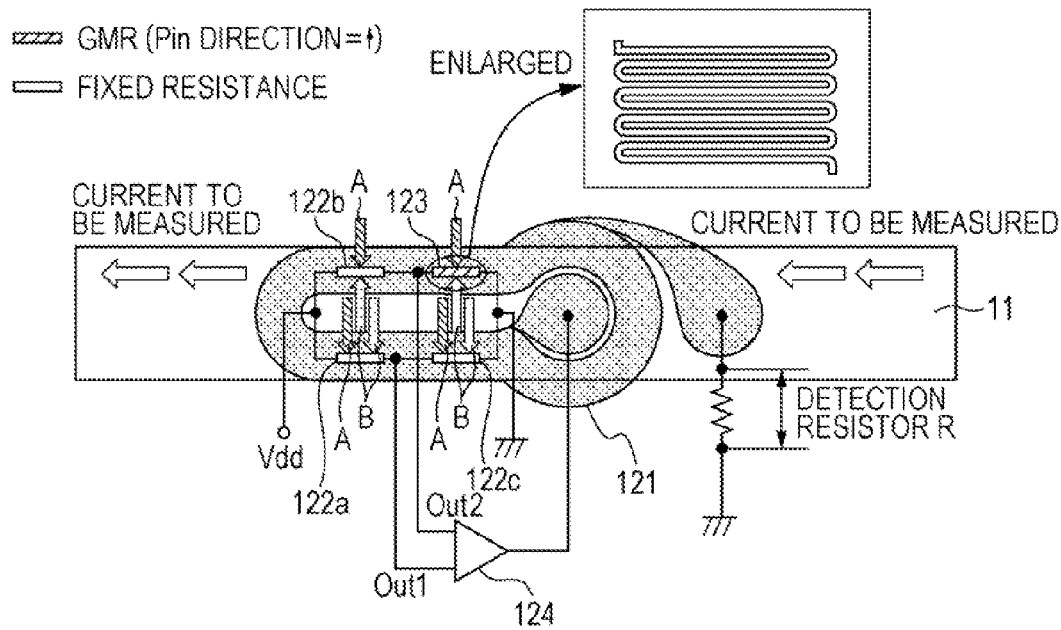
FIG. 7A is a diagram illustrating a current measurement state of the magnetic balance type current sensor illustrated in FIGS. 2A and 2B.
Figure 7B:
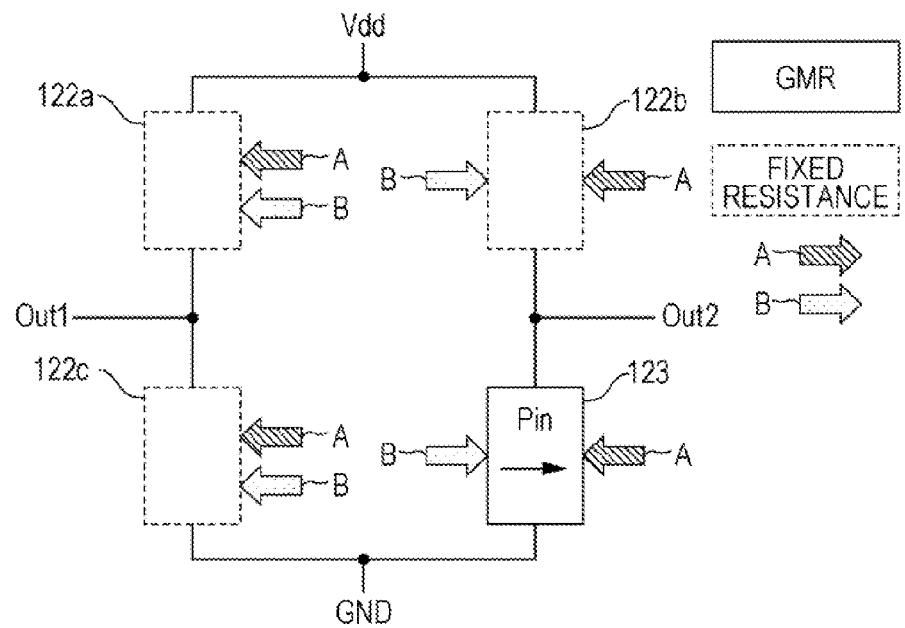
FIG. 7B is a diagram illustrating a magnetic detecting bridge circuit in the magnetic balance type current sensor illustrated in FIG. 7A.

In addition, as illustrated in FIG. 7A, if the current to be measured flows from the observers' right side of the plane of paper in FIGS. 7A and 7B, the induction magnetic field A and the cancelling magnetic field B are applied to the two fixed resistance elements 122a and 122c (on the Out1 side) in a direction opposite to the Pin direction, as illustrated in FIG. 7A. On the other hand, the induction magnetic field A is applied to the fixed resistance element 122b and the magnetoresistance effect element 123 (on the Out2 side) in a direction opposite to the Pin direction, and the cancelling magnetic field B is applied to the fixed resistance element 122b and the magnetoresistance effect element 123 in the Pin direction.

When a magnetic detecting bridge circuit and a feedback coil are integrally formed on a same substrate in the same way as the magnetic balance type current sensor according to the present invention, since it may be necessary to completely insulate the two from each other, the two are separated from each other using an organic insulation film such as a polyimide film. Usually the organic insulation film is formed by being subjected to heating treatment greater than or equal to 200° C. after application of spin coat or the like. Since the organic insulation film is formed in a post-process of the formation of the magnetic detecting bridge circuit, the magnetoresistance effect element is also heated together. In the manufacturing process of a magnetoresistance effect element of a type that fixes the magnetization of a fixed magnetic layer using an antiferromagnetic layer, it may be necessary to perform heating treatment with applying a magnetizing field so that the characteristic of the fixed magnetic layer is not deteriorated owing to the thermal history of the formation process of the organic insulation film. In the magnetic balance type current sensor according to the present invention, since no antiferromagnetic layer is used, it may be possible to maintain the characteristic of the fixed magnetic layer even if the heating treatment is not performed with a magnetizing field being applied. Accordingly, it may be possible to suppress the deterioration of the hysteresis of the soft magnetic free layer.

In addition, when the magnetoresistance effect element of a type that fixes the magnetization of a fixed magnetic layer using an antiferromagnetic layer is used, since the blocking temperature (a temperature at which an exchange-coupling magnetic field disappears) of an antiferromagnetic material is about 300° C. to 400° C., and the exchange-coupling magnetic field gradually decreases with drawing nigh to this temperature, the characteristic of the fixed magnetic layer becomes more unstable as a temperature becomes high. In the magnetic balance type current sensor according to the present invention, since no antiferromagnetic layer is used, the characteristic of the fixed magnetic layer mainly depends on the Curie temperature of a ferromagnetic material configuring the fixed magnetic layer. In general, the Curie temperature of a ferromagnetic material such as CoFe is far higher than the blocking temperature of an antiferromagnetic material. Accordingly, by causing the Curie temperatures of the ferromagnetic materials of the first ferromagnetic film and the second ferromagnetic film to coincide with each other and keeping, at zero, a difference in magnetization amount (Ms·t) between the first ferromagnetic film and the second ferromagnetic film also in a high temperature region, it may be possible to maintain a high magnetization stability.

In addition, when the magnetoresistance effect element of a type that fixes the magnetization of a fixed magnetic layer using an antiferromagnetic film is used, it is necessary to intentionally cause a difference between the magnetization amount (Ms·t) of the first ferromagnetic film and the magnetization amount (Ms·t) of the second ferromagnetic film, so as to generate the exchange-coupling magnetic field in the direction of an applied magnetizing field at the time of annealing. The reason is that when a difference in magnetization amount is zero, a magnetic field causing both the first ferromagnetic film and the second ferromagnetic film to be saturated exceeds a magnetizing field (to 15 kOe ($\times 103/4$ $\pi$A/m)) capable of being applied at the time of annealing and as a result, the magnetization dispersion of the first ferromagnetic film and the second ferromagnetic film after annealing becomes large, thereby causing the deterioration of $\Delta R/R$ to occur. In addition, so as to increase $\Delta R/R$, usually the film thickness of the second ferromagnetic film is caused to be thicker than the first ferromagnetic film (a magnetization amount is caused to be larger). Usually, when the magnetization amount of the second ferromagnetic film is larger than that of the first ferromagnetic film, a reflux magnetic field becomes large that is applied from the second ferromagnetic film to the soft magnetic free layer in an element side wall, and an influence on the asymmetry of an output becomes large. In addition, since this reflux magnetic field has a large temperature dependency, the temperature dependency of the asymmetry also becomes large. In the magnetic balance type current sensor according to the present invention, since a difference in magnetization amount between the first ferromagnetic film and the second ferromagnetic film in the magnetoresistance effect element is zero, it may also be possible to solve such a problem as described above.

In addition, since the magnetoresistance effect element of the magnetic balance type current sensor according to the present invention includes no antiferromagnetic material, it may also be possible to suppress a material cost or manufacturing cost.

Figure 10A:
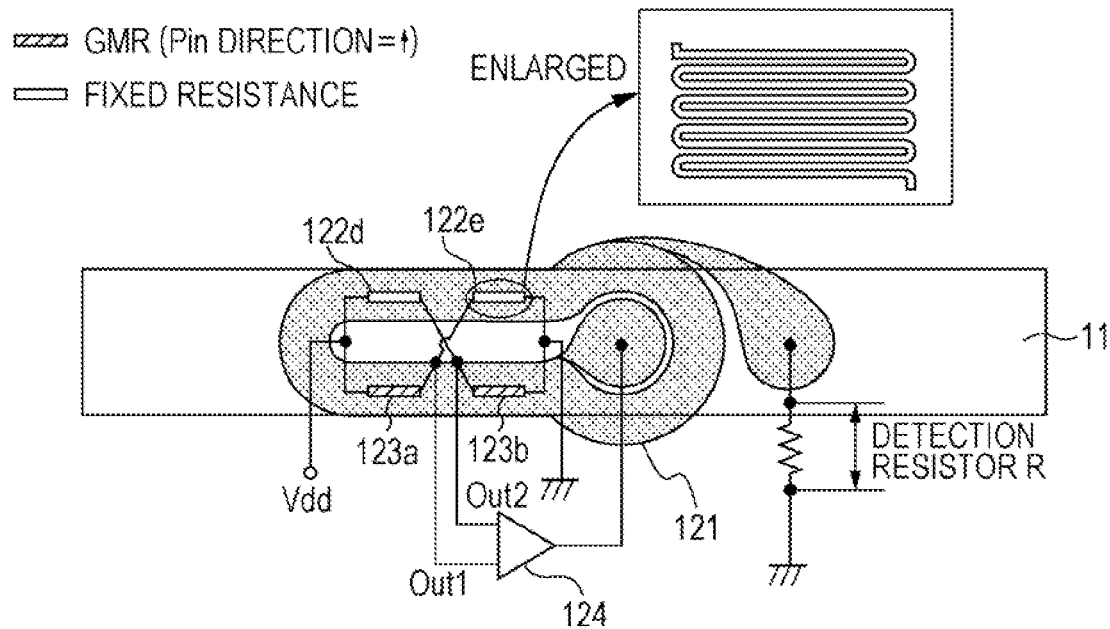
FIG. 10A is a diagram illustrating another example of a magnetic balance type current sensor according to an embodiment of the present invention.
Figure 10B:
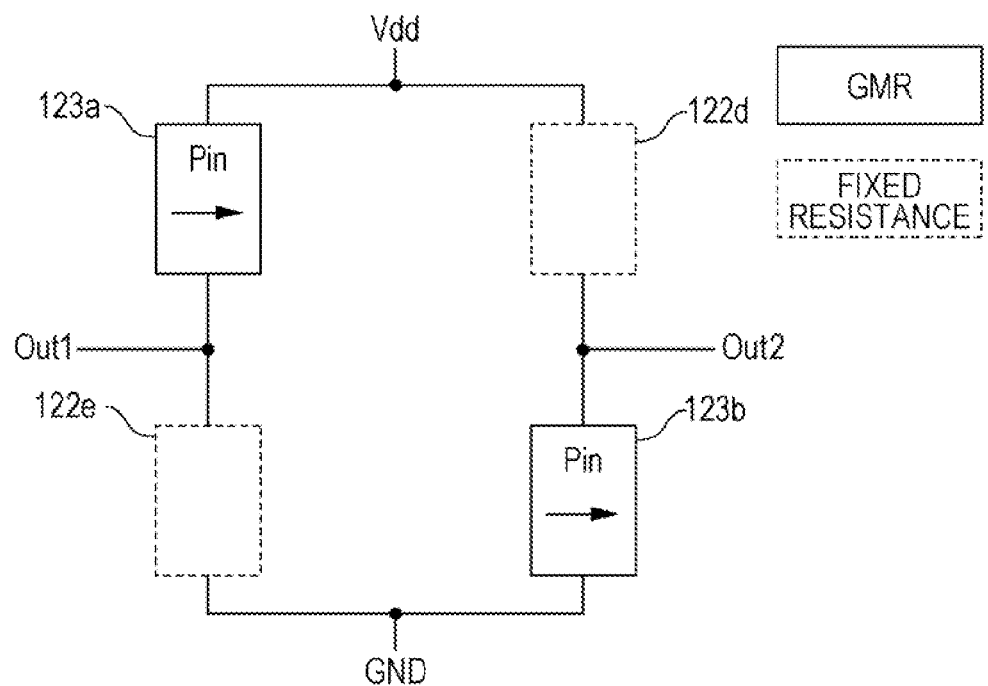
FIG. 10B is a diagram illustrating a magnetic detecting bridge circuit in the magnetic balance type current sensor illustrated in FIG. 10A.

FIG. 10A is a diagram illustrating another example of a magnetic balance type current sensor according to an embodiment of the present invention, and FIG. 10B is a diagram illustrating a magnetic detecting bridge circuit in the magnetic balance type current sensor illustrated in FIG. 10A.

In the magnetic balance type current sensor illustrated in FIG. 10A, the magnetic field detection bridge circuit includes two magnetoresistance effect elements 123a and 123b and fixed resistance elements 122d and 122e. The magnetic field detection bridge circuit includes two outputs for causing a voltage difference according to the induction magnetic field generated owing to the current Ito be measured.

In the magnetic field detection bridge circuit illustrated in FIG. 10B, a power source Vdd is connected to a connection point between the magnetoresistance effect element 123a and the fixed resistance element 122d, and a ground (GND) is connected to a connection point between the magnetoresistance effect element 123b and the fixed resistance element 122e. Furthermore, in the magnetic field detection bridge circuit, one output (Out1) is taken from a connection point between the magnetoresistance effect element 123a and the fixed resistance element 122e, and the other output (Out2) is taken from a connection point between the fixed resistance element 122d and the magnetoresistance effect element 123b. These two outputs are amplified by an amplifier 124, and then are applied to a feedback coil 121 as a current (feedback current). The feedback current corresponds to a voltage difference according to the induction magnetic field. At this time, the cancelling magnetic field for cancelling out the induction magnetic field is generated in the feedback coil 121. In addition, the current to be measured is measured by a detection unit (detection resistor R) on the basis of the current flowing in the feedback coil 121 at the time of an equilibrium state in which the induction magnetic field and the cancelling magnetic field cancel each other out.

Figure 11A:
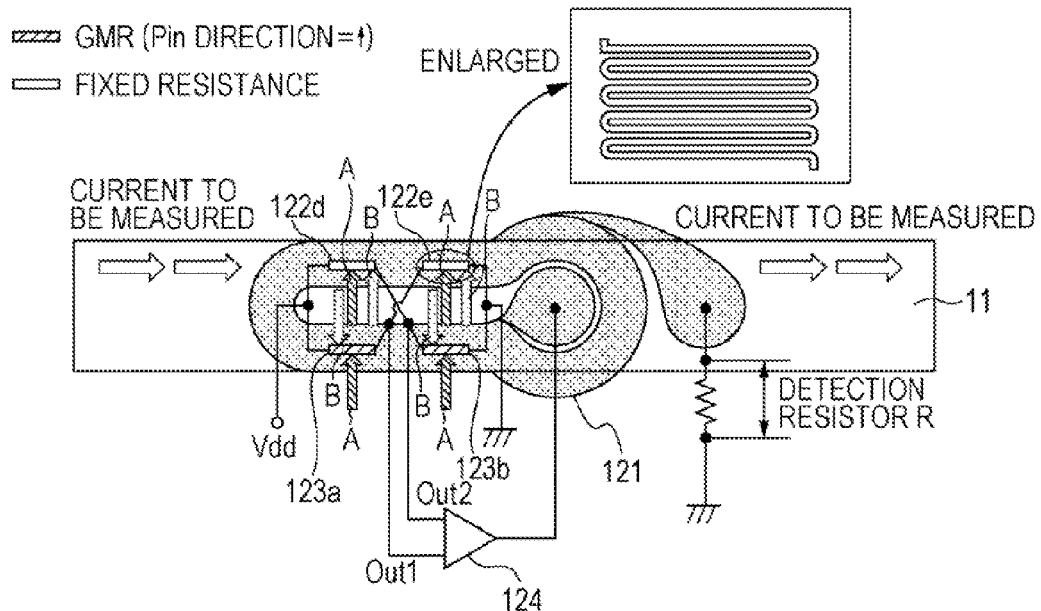
FIG. 11A is a diagram illustrating a current measurement state of the magnetic balance type current sensor illustrated in FIGS. 10A and 10B.
Figure 11B:
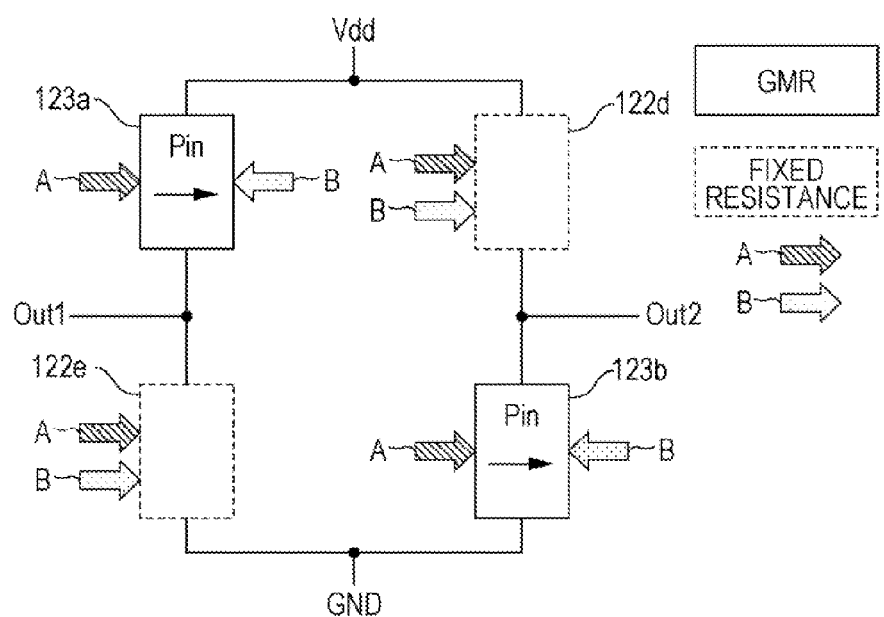
FIG. 11B is a diagram illustrating a magnetic detecting bridge circuit in the magnetic balance type current sensor illustrated in FIG. 11A.

As illustrated in FIG. 11A, if the current to be measured flows from the observers' left side of the plane of paper in FIGS. 11A and 11B, the induction magnetic field A and the cancelling magnetic field B are applied to the two fixed resistance elements 122d and 122e in the same direction (Pin direction), as illustrated in FIGS. 11A and 11B. On the other hand, the cancelling magnetic field B is applied to the magnetoresistance effect elements 123a and 123b in a direction opposite to the Pin direction, and the induction magnetic field A is applied to the magnetoresistance effect elements 123a and 123b in the Pin direction.

Figure 12A:
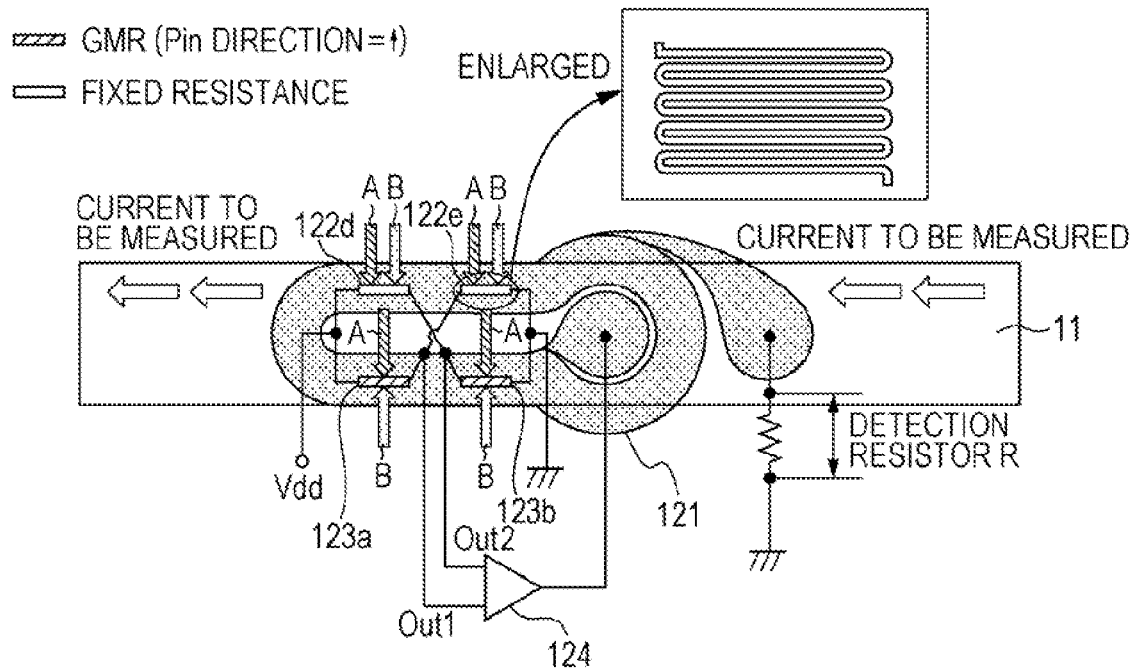
FIG. 12A is a diagram illustrating a current measurement state of the magnetic balance type current sensor illustrated in FIGS. 10A and 10B.
Figure 12B:
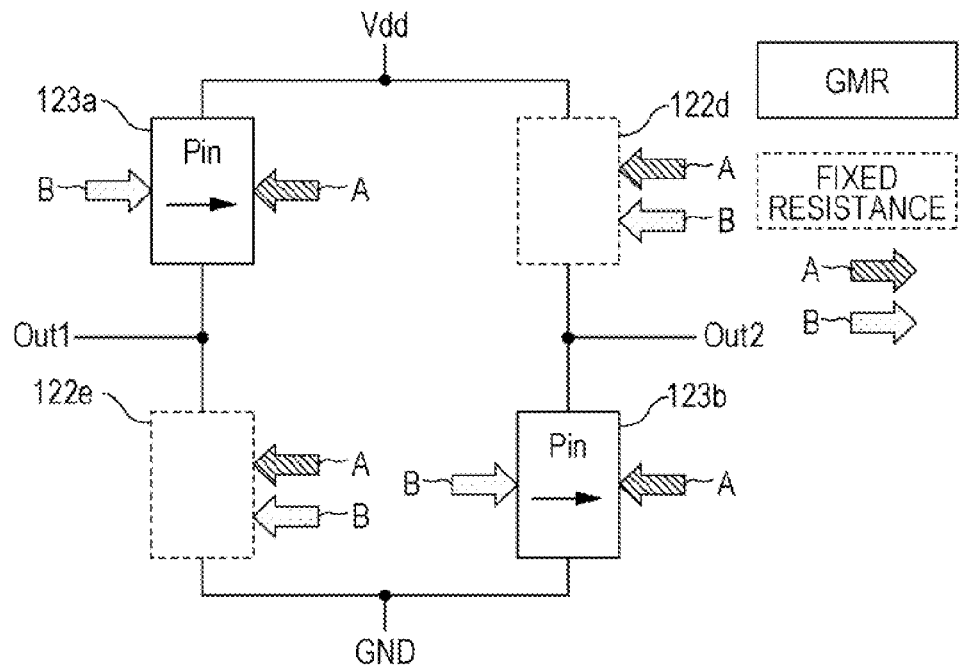
FIG. 12B is a diagram illustrating a magnetic detecting bridge circuit in the magnetic balance type current sensor illustrated in FIG. 12A.

In addition, as illustrated in FIG. 12A, if the current to be measured flows from the observers' right side of the plane of paper in FIGS. 12A and 12B, the induction magnetic field A and the cancelling magnetic field B are applied to the two fixed resistance elements 122d and 122e in a direction opposite to the Pin direction, as illustrated in FIG. 12A. On the other hand, the induction magnetic field A is applied to the magnetoresistance effect elements 123a and 123b in a direction opposite to the Pin direction, and the cancelling magnetic field B is applied to the magnetoresistance effect elements 123a and 123b in the Pin direction.

Figure 13A:
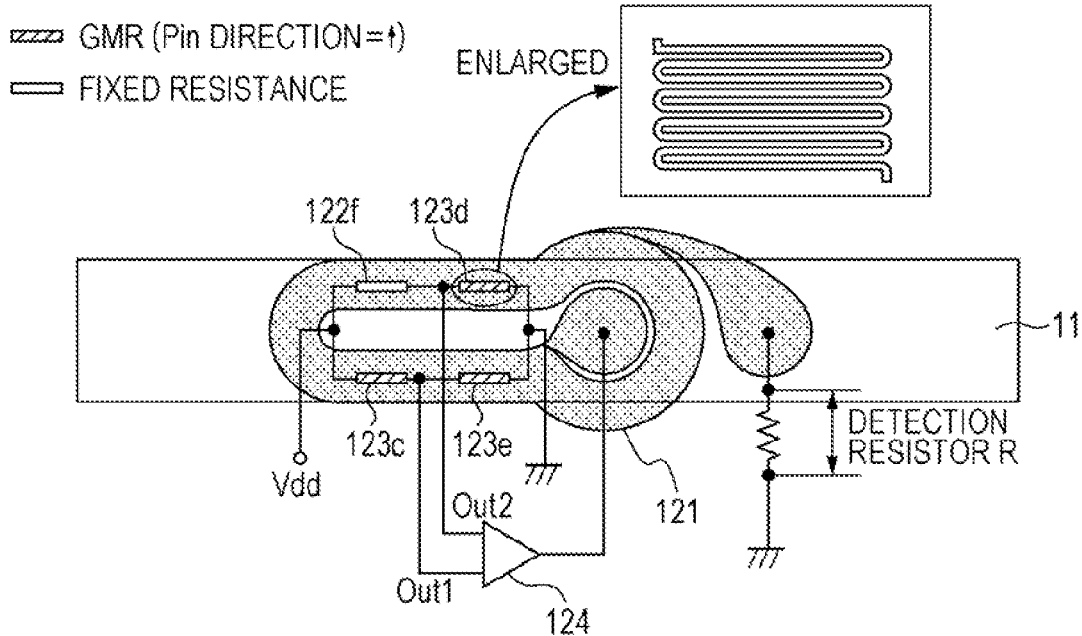
FIG. 13A is a diagram illustrating another example of a magnetic balance type current sensor according to an embodiment of the present invention.
Figure 13B:
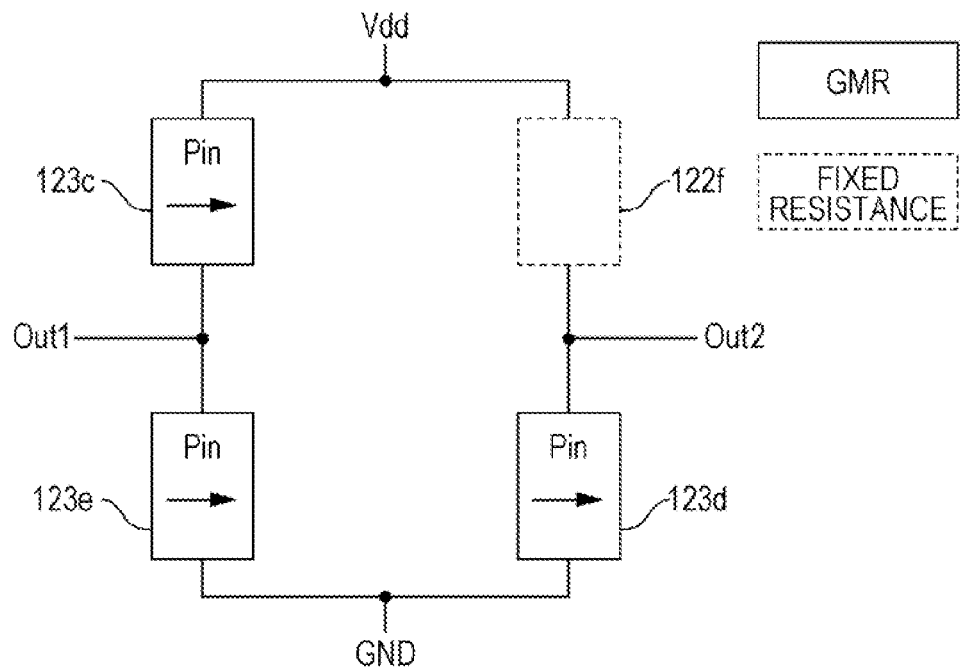
FIG. 13B is a diagram illustrating a magnetic detecting bridge circuit in the magnetic balance type current sensor illustrated in FIG. 13A.

FIG. 13A is a diagram illustrating another example of a magnetic balance type current sensor according to an embodiment of the present invention, and FIG. 13B is a diagram illustrating a magnetic detecting bridge circuit in the magnetic balance type current sensor illustrated in FIG. 13A.

In the magnetic balance type current sensor illustrated in FIGS. 13A and 13B, the magnetic field detection bridge circuit includes three magnetoresistance effect elements 123c to 123e and a fixed resistance element 122f. The magnetic field detection bridge circuit includes two outputs for causing a voltage difference according to the induction magnetic field generated owing to the current I to be measured. In a state not corresponding to the time of measurement, the resistance values of the three magnetoresistance effect elements 123c to 123e and the fixed resistance element 122f are equal to one another.

In the magnetic field detection bridge circuit illustrated in FIG. 13B, a power source Vdd is connected to a connection point between the magnetoresistance effect element 123c and the fixed resistance element 122f, and a ground (GND) is connected to a connection point between the magnetoresistance effect elements 123d and 123e. Furthermore, in the magnetic field detection bridge circuit, one output (Out1) is taken from a connection point between the magnetoresistance effect elements 123c and 123e, and the other output (Out2) is taken from a connection point between the fixed resistance element 122f and the magnetoresistance effect element 123d. These two outputs are amplified by an amplifier 124, and then are applied to a feedback coil 121 as a current (feedback current). The feedback current corresponds to a voltage difference according to the induction magnetic field. At this time, the cancelling magnetic field for cancelling out the induction magnetic field is generated in the feedback coil 121. In addition, the current to be measured is measured by a detection unit (detection resistor R) on the basis of the current flowing in the feedback coil 121 at the time of an equilibrium state in which the induction magnetic field and the cancelling magnetic field cancel each other out.

Figure 14A:
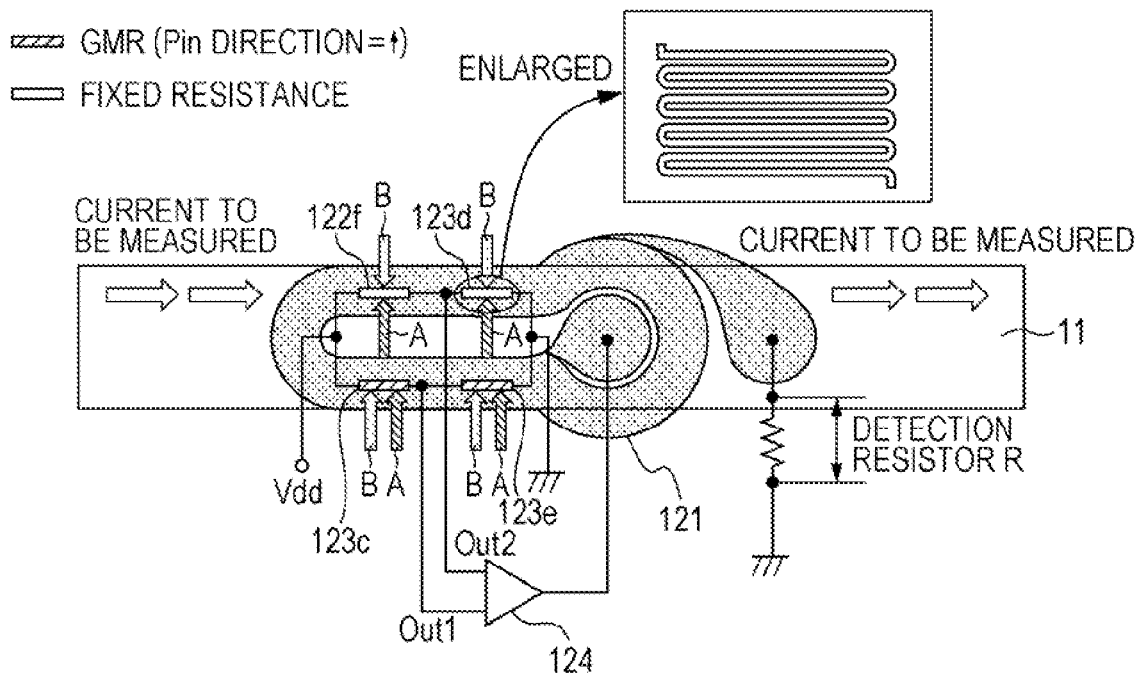
FIG. 14A is a diagram illustrating a current measurement state of the magnetic balance type current sensor illustrated in FIGS. 13A and 13B.
Figure 14B:
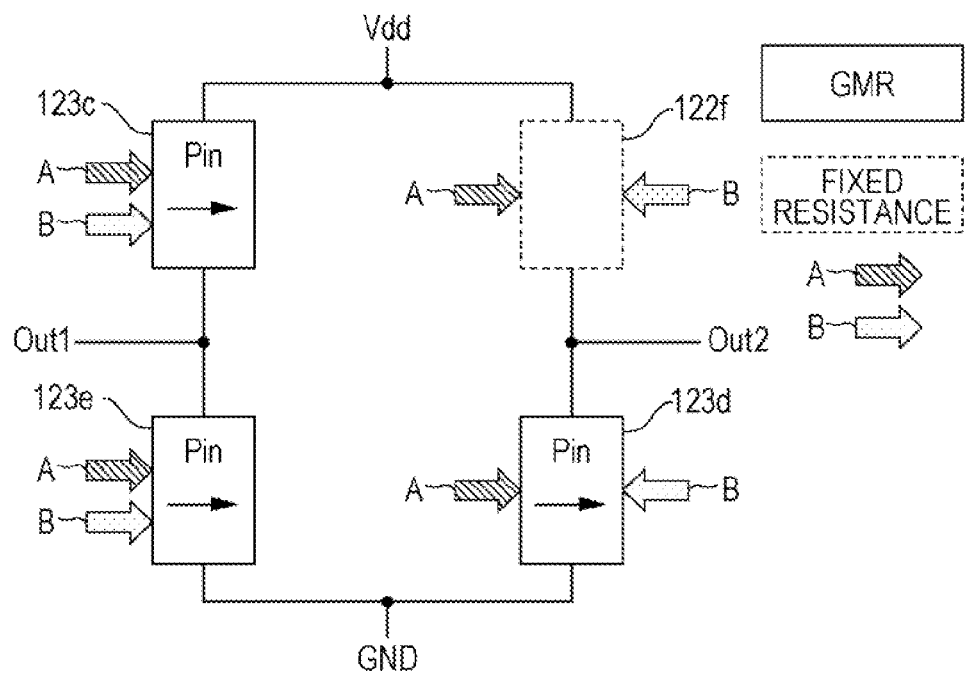
FIG. 14B is a diagram illustrating a magnetic detecting bridge circuit in the magnetic balance type current sensor illustrated in FIG. 14A.

As illustrated in FIG. 14A, if the current to be measured flows from the observers' left side of the plane of paper in FIGS. 14A and 14B, the induction magnetic field A and the cancelling magnetic field B are applied to the two magnetoresistance effect elements 123c and 123e in the same direction (Pin direction), as illustrated in FIGS. 14A and 14B. On the other hand, the cancelling magnetic field B is applied to the magnetoresistance effect element 123d and the fixed resistance element 122f in a direction opposite to the Pin direction, and the induction magnetic field A is applied to the magnetoresistance effect element 123d and the fixed resistance element 122f in the Pin direction. In this case, since the resistance values of the magnetoresistance effect elements 123c and 123e are equal to each other independently of the intensity of the induction magnetic field A, the magnetoresistance effect elements 123c and 123e serve as fixed resistance elements in the magnetic detecting bridge circuit.

Figure 15A:
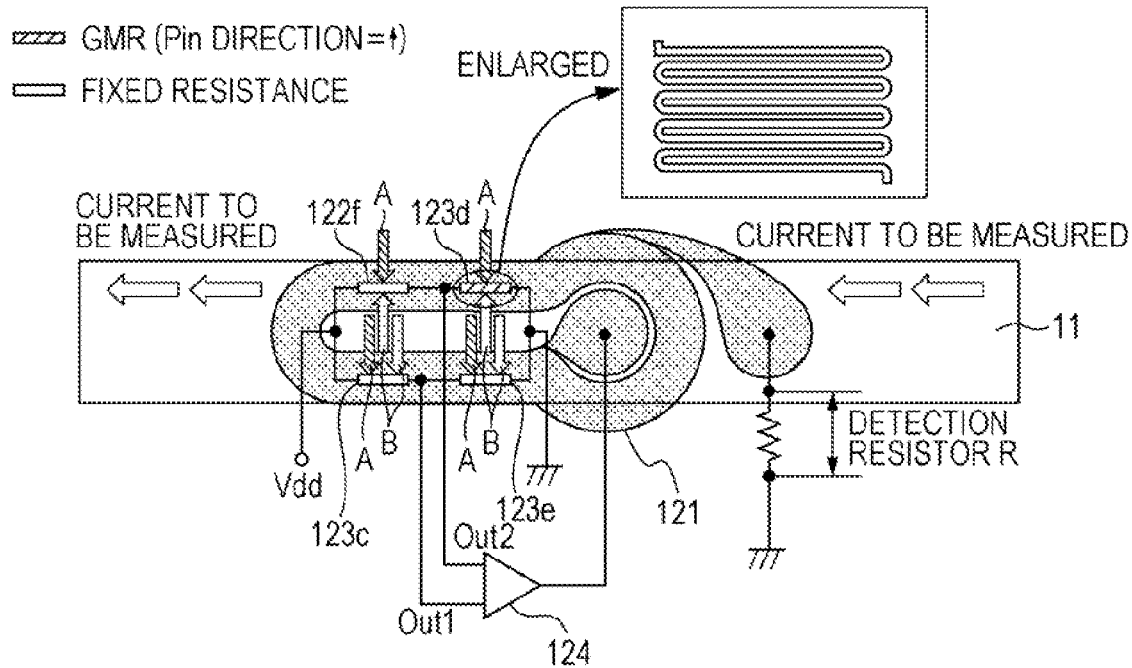
FIG. 15A is a diagram illustrating a current measurement state of the magnetic balance type current sensor illustrated in FIGS. 13A and 13B.
Figure 15B:
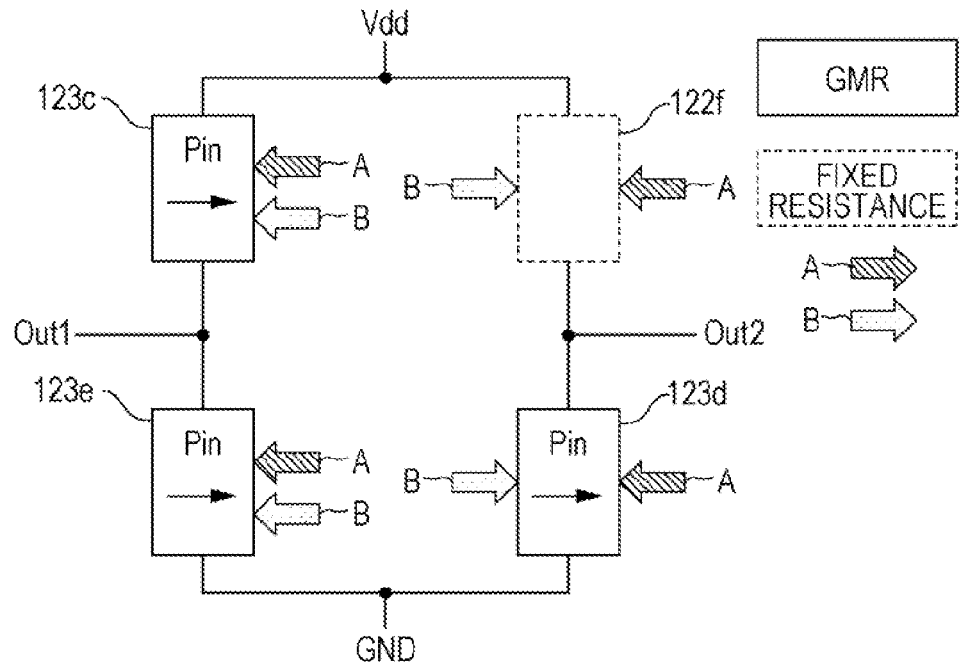
FIG. 15B is a diagram illustrating a magnetic detecting bridge circuit in the magnetic balance type current sensor illustrated in FIG. 15A.

In addition, as illustrated in FIG. 15A, if the current to be measured flows from the observers' right side of the plane of paper in FIGS. 15A and 15B, the induction magnetic field A and the cancelling magnetic field B are applied to the two magnetoresistance effect elements 123c and 123e in a direction opposite to the Pin direction, as illustrated in FIG. 15A. On the other hand, the induction magnetic field A is applied to the magnetoresistance effect element 123d and the fixed resistance element 122f in a direction opposite to the Pin direction, and the cancelling magnetic field B is applied to the magnetoresistance effect element 123d and the fixed resistance element 122f in the Pin direction. In this case, since the resistance values of the magnetoresistance effect elements 123c and 123e are equal to each other independently of the intensity of the induction magnetic field A, the magnetoresistance effect elements 123c and 123e serve as fixed resistance elements in the magnetic detecting bridge circuit.

In this way, according to the magnetic sensor according to the present invention, since the antiparallel coupling film of a self-pinned type ferromagnetic fixed layer is the Ru film having the thickness of the first peak of an antiferromagnetic coupling effect and a difference in magnetization amount between the first ferromagnetic film and the second ferromagnetic film is substantially zero, it may be possible to suppress the occurrence of the AMR effect due to a fixed resistance element. In addition, according to the magnetic balance type current sensor according to the present invention, since a magnetic sensor suppressing the occurrence of the AMR effect is used, it may be possible to obtain a sufficiently stable output characteristic when an ambient temperature has changed.

The present invention is not limited to the above-mentioned embodiments, and may be implemented with being variously modified. For example, the material, the connection relationship of each element, the thickness, the size, and the manufacturing method in the above-mentioned embodiments may be implemented with being arbitrarily modified. In addition, the present invention may be implemented with being variously modified and without departing from the scope of the invention.

The present invention may be applied to a current sensor for detecting the intensity of a current used for driving a motor of an electric vehicle.

What is claimed is:
1. A magnetic sensor comprising:
   a magnetoresistance effect element whose resistance value changes based on an induction magnetic field applied thereto from a current to be measured flowing through a conductor; and a fixed resistance element including a self-pinned type ferromagnetic fixed layer,
wherein the self-pinned type ferromagnetic fixed layer includes a first ferromagnetic film, a second ferromagnetic film, and an antiparallel coupling film interposed therebetween, the first and second ferromagnetic films being antiferromagnetically coupled to each other via the antiparallel coupling film, the antiparallel coupling film being an Ru film having a thickness corresponding to a first peak of an antiferromagnetic coupling effect, and a difference in magnetization amount between the first ferromagnetic film and the second ferromagnetic film is substantially zero.

2. The magnetic sensor according to claim 1, wherein the magnetoresistance effect element includes:
a self-pinned type ferromagnetic fixed layer includes a first ferromagnetic film, a second ferromagnetic film, an antiparallel coupling film provided between the first and second ferromagnetic films, a non-magnetic intermediate layer, and a soft magnetic free layer, wherein the first ferromagnetic film and the second ferromagnetic film are antiferromagnetically coupled to each other via the antiparallel coupling film, and have a substantially the same Curie temperature, and wherein a difference in magnetization amount between the first and second ferromagnetic films is substantially zero.

3. The magnetic sensor according to claim 1, wherein the first ferromagnetic film is formed of CoFe alloy including Fe of 40 atomic percent to 80 atomic percent, and the second ferromagnetic film is formed of CoFe alloy including Fe of 0 atomic percent to 40 atomic percent.

4. The magnetic sensor according to claim 3, wherein the thickness of the Ru film is in a range of 0.3 nm to 0.45 nm.

5. A magnetic balance type current sensor comprising:
the magnetic sensor according to claim 1;
a magnetic field detection bridge circuit configured to provide two outputs having a voltage difference corresponding to the induction magnetic field;
a feedback coil disposed in a vicinity of the magnetoresistance effect element, the feedback coil generating a cancelling magnetic field for cancelling the induction magnetic field; and
a magnetic shield configured to attenuate the induction magnetic field and enhance the cancelling magnetic field,
wherein the current to be measured is measured based on a current flowing through the feedback coil in a balanced state where the feedback coil is being energized by the voltage difference such that the induction magnetic field and the cancelling magnetic field cancel each other.

6. The magnetic balance type current sensor according to claim 5, wherein
the feedback coil, the magnetic shield, and the magnetic field detection bridge circuit are formed on a same substrate.

7. The magnetic balance type current sensor according to claim 5, herein the feedback coil is disposed between the magnetic shield and the magnetic field detection bridge circuit, the magnetic shield being disposed between the feedback coil and the conductor through which the current to be measured flows.

8. The magnetic balance type current sensor according to claim 5, wherein the magnetoresistance effect element has a meander shape including a plurality of stripe patterns parallel to one another and connected in a folded manner, and the induction magnetic field and the cancelling magnetic field are applied in a direction perpendicular to a longitudinal direction of the strip patterns.

9. The magnetic balance type current sensor according to claim 5, wherein the magnetic shield is formed of a material having a high magnetic permeability selected from a group consisting of an amorphous magnetic material, a permalloy-based magnetic material, and an iron-based microcrystalline material.

10. The magnetic sensor according to claim 1, wherein the first ferromagnetic film is formed of CoFe alloy including Fe of 40 atomic percent to 80 atomic percent, and the second ferromagnetic film is formed of CoFe alloy including Fe of 0 atomic percent to 40 atomic percent.

11. The magnetic sensor according to claim 10, wherein the thickness of the Ru film is in a range of 0.3 nm to 0.45 nm.

12. A magnetic sensor comprising:
a magnetoresistance effect element whose resistance value changes based on a magnetic field applied thereto; and
a fixed resistance element including a self-pinned type ferromagnetic fixed layer,
wherein the self-pinned type ferromagnetic fixed layer includes: a first ferromagnetic film; a second ferromagnetic film; and an antiparallel coupling film interposed therebetween, the first and second ferromagnetic films being antiferromagnetically coupled to each other via the antiparallel coupling film, the antiparallel coupling film being an Ru film having a thickness corresponding to a first peak of an antiferromagnetic coupling effect, and a difference in magnetization amount between the first ferromagnetic film and the second ferromagnetic film is substantially zero.

13. The magnetic sensor according to claim 12, wherein the magnetoresistance effect element includes:
a self-pinned type ferromagnetic fixed layer includes a first ferromagnetic film, a second ferromagnetic film, an antiparallel coupling film provided between the first and second ferromagnetic films, a non-magnetic intermediate layer, and a soft magnetic free layer, wherein the first ferromagnetic film and the second ferromagnetic film are antiferromagnetically coupled to each other via the antiparallel coupling film, and have a substantially the same Curie temperature, and wherein a difference in magnetization amount between the first and second ferromagnetic films is substantially zero.

* * * * *